US012787545B2

(12) United States Patent
Song et al.

(10) Patent No.: US 12,787,545 B2
(45) Date of Patent: Nov. 3, 2026

(54) DISPLAY DEVICE

(71) Applicant: LG Display Co., Ltd., Seoul (KR)

(72) Inventors: JiHun Song, Seoul (KR); Hoiyong Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 474 days.

(21) Appl. No.: 18/371,214

(22) Filed: Sep. 21, 2023

(65) Prior Publication Data

US 2024/0107806 A1 Mar. 28, 2024

(30) Foreign Application Priority Data

Sep. 27, 2022 (KR) ........................ 10-2022-0122822

(51) Int. Cl.
*H10K 59/121* (2023.01)
*H10K 59/127* (2023.01)
*H10K 59/80* (2023.01)

(52) U.S. Cl.
CPC ..... *H10K 59/1213* (2023.02); *H10K 59/1216* (2023.02); *H10K 59/127* (2023.02); *H10K 59/8722* (2023.02); *H10K 59/8793* (2023.02)

(58) Field of Classification Search
CPC ........... H10K 59/1213; H10K 59/8722; H10K 59/1216; H10K 59/8793; H10K 59/127
USPC .......................................................... 313/500
See application file for complete search history.

(56) References Cited

U.S. PATENT DOCUMENTS

| | | | | |
|---|---|---|---|---|
| 10,802,638 | B1 * | 10/2020 | Yeh | G06F 3/0488 |
| 2013/0163067 | A1 | 6/2013 | Kim et al. | |
| 2014/0021856 | A1 | 1/2014 | Jung et al. | |
| 2015/0072124 | A1 | 3/2015 | Sakaguchi | |
| 2016/0079319 | A1 * | 3/2016 | Lim | H10K 59/878 257/40 |
| 2017/0345880 | A1 * | 11/2017 | Kim | H10K 59/122 |
| 2019/0181378 | A1 | 6/2019 | Song et al. | |
| 2020/0314515 | A1 * | 10/2020 | Jang | H04R 1/028 |

(Continued)

FOREIGN PATENT DOCUMENTS

| | | |
|---|---|---|
| KR | 10-2014-0011792 A | 1/2014 |
| KR | 10-2019-0068919 A | 6/2019 |
| KR | 10-2019-0079227 A | 7/2019 |

(Continued)

OTHER PUBLICATIONS

K-PION Patent File Wrapper Search (Year: 2026).*
Extended European Search Report issued in EP application 23192657.7 dated Jan. 5, 2024.

*Primary Examiner* — James R Greece
*Assistant Examiner* — Hana S Featherly
(74) *Attorney, Agent, or Firm* — Morgan, Lewis & Bockius LLP

(57) ABSTRACT

A display device includes a first substrate including a display area having a plurality of pixels, and a non-display area surrounding the display area, the first substrate being made of one of transparent conducting oxide and oxide semiconductor; an inorganic layer on the first substrate; a planarization layer on the inorganic layer; a bonding layer on the inorganic layer and the planarization layer; and a second substrate on the bonding layer. The planarization layer includes a first planarization layer overlapping the first substrate in a plan view, and a second planarization layer surrounding a side surface of the first planarization layer.

16 Claims, 13 Drawing Sheets

(56) References Cited

U.S. PATENT DOCUMENTS

2020/0326571 A1 * 10/2020 Hanada ................. G02F 1/1368
2024/0065041 A1 2/2024 Kwon

FOREIGN PATENT DOCUMENTS

KR 10-2024-0025337 A 2/2024
WO 2013/056875 A1 4/2013

* cited by examiner

DISPLAY DEVICE

CROSS-REFERENCE TO RELATED APPLICATIONS

This application claims the priority of Korean Patent Application No. 10-2022-0122822 filed on Sep. 27, 2022, in the Korean Intellectual Property Office, which is incorporated herein by reference.

BACKGROUND

Technical Field

The present disclosure relates to a display device, and more particularly, to a display device not using a plastic substrate, thereby improving moisture transmission properties and reducing the occurrence of cracks in an area of an outer peripheral portion.

Discussion of the Related Art

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, a flexible display device, which is made by forming display elements, lines, and the like on a substrate made of a flexible plastic material having flexibility and thus may display images even by being folded or rolled up, has attracted attention as a next-generation display device.

SUMMARY

Accordingly, embodiments of the present disclosure are directed to a display device that substantially obviates one or more of the problems due to limitations and disadvantages of the related art.

An aspect of the present disclosure is to provide a display device that uses a substrate configured as a transparent conducting oxide layer and/or an oxide semiconductor layer, instead of a plastic substrate.

Another aspect of the present disclosure is to provide a display device, in which occurrences of cracks are reduced in a substrate and an inorganic layer at an outer peripheral portion of the display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a first substrate including a display area having a plurality of pixels, and a non-display area surrounding the display area, the first substrate being made of a transparent conducting oxide and/or oxide semiconductor; an inorganic layer on the first substrate; a planarization layer on the inorganic layer; a bonding layer on the inorganic layer and the planarization layer; and a second substrate on the bonding layer, wherein the planarization layer includes a first planarization layer overlapping the first substrate in a plan view; and a second planarization layer surrounding a side surface of the first planarization layer.

In another aspect, A display device, comprises a first substrate including a display area having a plurality of pixels, and a non-display area surrounding the display area, the first substrate being made of one of transparent conducting oxide and oxide semiconductor; a plurality of inorganic layers on the first substrate; a planarization layer on the plurality of inorganic layers; a bonding layer on the plurality of inorganic layers and the planarization layer; a second substrate on the bonding layer; and a seal member surrounding a side surface of the second substrate and a side surface of the planarization layer, wherein the planarization layer surrounds a side surface of the first substrate and a side surface of the inorganic layer.

Other detailed matters of exemplary embodiments are included in the detailed description and the drawings.

According to the present disclosure, it is possible to easily control moisture permeability using the transparent conducting oxide layer or the oxide semiconductor layer as the substrate of the display device, thereby improving flexibility.

According to the present disclosure, it is possible to suppress or at least reduce damage to the display panel that may occur on a scribed cut surface.

According to the present disclosure, the planarization layer may be disposed outside the first substrate to reduce the occurrence of cracks in the inorganic layer and the first substrate formed from the outer peripheral portion of the display device, thereby improving reliability of the display device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
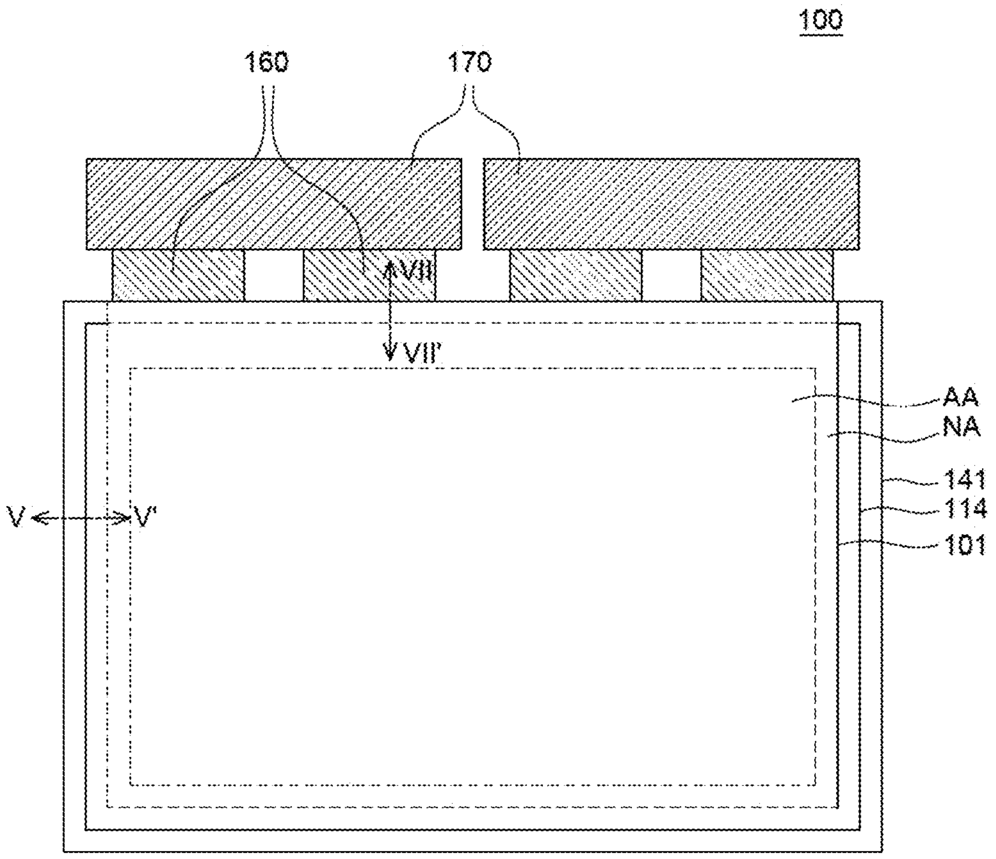
FIG. 1 is a top plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

Figure 2:
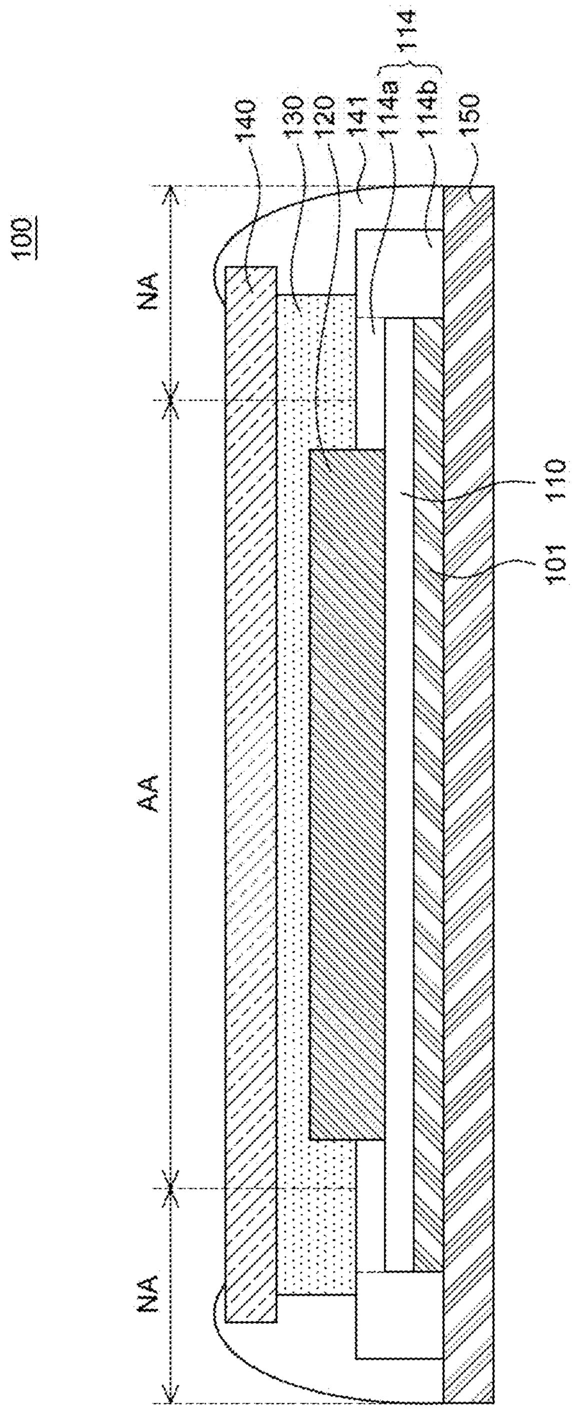
FIG. 2 is a schematic cross-sectional view of the display device according to an exemplary embodiment of the present disclosure.

FIG. 1 is a top plan view of a display device according to an exemplary embodiment of the present disclosure. FIG. 2 is a schematic cross-sectional view of the display device according to an exemplary embodiment of the present disclosure. For convenience of description, FIG. 1 illustrates only a first substrate 101, a seal member 141, a planarization layer 114, a plurality of flexible films 160, and a plurality of printed circuit boards 170 among various constituent elements of a display device 100.

With reference to FIGS. 1 and 2, the first substrate 101 is a support member for supporting the other constituent elements of the display device 100. The first substrate 101 may be made of a transparent conducting oxide and/or an oxide semiconductor. For example, the first substrate 101 may be made of transparent conducting oxide (TCO), such as indium tin oxide (ITO), indium zinc oxide (IZO), and indium-tin-zinc oxide (ITZO).

In addition, the first substrate 101 may be made of an oxide semiconductor material containing indium (In) and gallium (Ga), for example, a transparent oxide semiconductor, such as indium-gallium-zinc oxide (IGZO), indium gallium oxide (IGO), and indium-tin-zinc oxide (ITZO). However, the materials and types of transparent conducting oxide and oxide semiconductors are exemplarily provided. The first substrate 101 may be made of other transparent conducting oxide and oxide semiconductor materials that are not disclosed in the present specification. However, the present disclosure is not limited thereto.

Meanwhile, the first substrate 101 may be formed by depositing the transparent conducting oxide or oxide semiconductor with a very small thickness. Therefore, the first substrate 101 may have flexibility because the first substrate 101 has a very small thickness. Further, the display device 100 including the first substrate 101 having flexibility may be implemented as the flexible display device 100 that may display images even though the display device 100 is folded or rolled up. For example, if the display device 100 is a foldable display device, the first substrate 101 may be folded or unfolded about a folding axis. As another example, if the display device 100 is a rollable display device, the display device may be rolled up around a roller and stored. Therefore, the display device 100 according to an exemplary embodiment of the present disclosure may be implemented as the flexible display device 100, such as a foldable display device or a rollable display device, using the first substrate 101 having flexibility.

In addition, the display device 100 may perform a laser-lift-off (LLO) process using the first substrate 101 made of the transparent conducting oxide or oxide semiconductor. The LLO process means a process of separating a temporary substrate, which is disposed below the first substrate 101, from the first substrate 101 using a laser during a process of manufacturing the display device 100. Therefore, the first substrate 101 is a layer for further facilitating the LLO process, and thus the first substrate 101 may be referred to as a functional thin-film, a functional thin-film layer, or a functional substrate. The LLO process will be described below in more detail.

The first substrate 101 includes a display area AA and a non-display area NA. The display area AA is an area in which images are displayed. To display the image, a pixel part 120 including a plurality of subpixels may be disposed in the display area AA. For example, the pixel part 120 may include the plurality of subpixels including light-emitting elements and drive circuits, thereby displaying the image. The non-display area NA is an area in which no image is displayed. Various lines, drive ICs, and the like for operating the subpixels disposed in the display area AA are disposed. For example, various drive ICs, such as a gate driver IC and a data driver IC, may be disposed in the non-display area NA.

The plurality of flexible films 160 is disposed at one end of the first substrate 101. The plurality of flexible films 160 is electrically connected to one end of the first substrate 101. The plurality of flexible films 160 each are a film having various types of components disposed on a base film having flexibility to supply signals to the plurality of subpixels in the display area AA. The plurality of flexible films 160 may each be disposed at one end of the non-display area NA of the first substrate 101 and supply data voltage or the like to the plurality of subpixels in the display area AA. Meanwhile, FIG. 1 illustrates four flexible films 160. However, the number of flexible films 160 may be variously changed in accordance with design. However, the present disclosure is not limited thereto.

Meanwhile, drive ICs, such as gate driver ICs and data driver ICs, may be disposed on the plurality of flexible films 160. The drive IC is a component configured to process data for displaying the image and process a driving signal for processing the data. The drive IC may be disposed in various ways, such as a chip-on-glass (COG) method, a chip-on-film (COF) method, and a tape carrier package (TCP) method, depending on how the drive IC is mounted. In the present specification, for the convenience of description, the configuration has been described in which the drive ICs are mounted on the plurality of flexible films 160 by the chip-on-film method. However, the present disclosure is not limited thereto.

The printed circuit boards 170 are connected to the plurality of flexible films 160. The printed circuit board 170 is a component for supplying a signal to a drive IC. Various types of components for supplying the drive IC with various driving signals, such as driving signals, data voltages, and the like, may be disposed on the printed circuit board 170. Meanwhile, FIG. 1 illustrates two printed circuit boards 170. However, the number of printed circuit boards 170 may be variously changed in accordance with design. The present disclosure is not limited thereto.

With reference to FIGS. 1 and 2, an inorganic layer 110 is disposed on the first substrate 101. The inorganic layer 110 may be a plurality of inorganic layers including a lower buffer layer 116, an upper buffer layer 111, a gate insulation layer 112 and a passivation layer 113 that will be described below with reference to FIGS. 3 to 6C. The inorganic layer 110 will be described below in detail with reference to FIGS. 4 to 7C.

The planarization layer 114 is disposed on the inorganic layer 110. The planarization layer 114 may be disposed in the non-display area NA and surround the first substrate 101. The planarization layer 114 will be described below in detail with reference to FIGS. 4 to 7C.

The pixel part 120 is disposed on the inorganic layer 110. The pixel part 120 may be disposed to correspond to the display area AA. The pixel part 120 includes the plurality of subpixels and is configured to display an image. The plurality of subpixels of the pixel part 120 are minimum units constituting the display area AA. The light-emitting element and the drive circuit may be disposed in each of the plurality of subpixels. For example, the light-emitting element of each of the plurality of subpixels may be an organic light-emitting element including an anode, an organic light-emitting layer, and a cathode or be an LED including N-type and P-type semiconductor layers and a light-emitting layer. However, the present disclosure is not limited thereto. Further, the drive circuit for operating the plurality of subpixels may include driving elements, such as thin-film transistors and a storage capacitor. However, the present disclosure is not limited thereto. Hereinafter, for the convenience of description, the assumption is made that the light-emitting element of each of the plurality of subpixels is the organic light-emitting element. However, the present disclosure is not limited thereto.

Meanwhile, the display device 100 may be a top-emission type display device or a bottom-emission type display device depending on a direction in which light is emitted from the light-emitting element.

The top-emission type display device allows the light emitted from the light-emitting element to propagate toward an upper side of the first substrate 101 on which the light-emitting element is disposed. The top-emission type display device may have a reflective layer formed on a lower portion of the anode to allow the light emitted from the light-emitting element to propagate toward the upper side of the first substrate 101, e.g., toward the cathode.

The bottom-emission type display device allows the light emitted from the light-emitting element to propagate toward a lower side of the first substrate 101 on which the light-emitting element is disposed. In the case of the bottom-emission type display device, the anode may be made of only a transparent electrically conductive material and the cathode may be made of a metallic material with high reflectance to allow the light emitted from the light-emitting element to propagate toward the lower side of the first substrate 101.

Hereinafter, for the convenience of description, the display device 100 will be described as being the bottom-emission type display device. However, the present disclosure is not limited thereto.

A bonding layer 130 is disposed to cover the pixel part 120. The bonding layer 130 may serve to bond the first substrate 101 and a second substrate 140. The bonding layer 130 may seal the pixel part 120 and protect the light-emitting element of the pixel part 120 from outside moisture, oxygen, impact, and the like. The bonding layer 130 may be configured as a face seal type bonding layer. For example, the bonding layer 130 may be formed by applying an ultraviolet-curable or thermosetting sealant onto the entire surface of the pixel part 120. However, the bonding layer 130 may have various structures and be made of various materials. However, the present disclosure is not limited thereto.

Meanwhile, the second substrate 140 is disposed on the bonding layer 130. The second substrate 140 is made of a metallic material having a high modulus and high corrosion resistance. For example, the second substrate 140 may be made of a material having a modulus as high as about 200 to 900 MPa. The second substrate 140 may be made of a metallic material, such as aluminum (Al), nickel (Ni), chromium (Cr), iron (Fe), and an alloy of nickel which is easily machined in the form of a foil or thin-film and has high corrosion resistance. Therefore, because the second substrate 140 is made of a metallic material, the second substrate 140 may be implemented in the form of an ultrathin-film and have protection characteristics strong against outside impact and scratches.

A polarizing plate 150 is disposed below the first substrate 101. The polarizing plate 150 may selectively transmit light and reduce the reflection of external light entering the first substrate 101. For example, the display device 100 may have various metallic materials formed on the first substrate 101 and applied to a semiconductor element, a line, and a light-emitting element. Therefore, external light entering the first substrate 101 may be reflected by the metallic material. The reflection of external light may decrease visibility of the display device 100. In this case, the polarizing plate 150 for suppressing the reflection of external light may be disposed below the first substrate 101, thereby improving outdoor visibility of the display device 100. However, the polarizing plate 150 may be eliminated in accordance with the implementation of the display device 100.

Meanwhile, although not illustrated in the drawings, a barrier film, together with the polarizing plate 150, may be disposed below the first substrate 101. The barrier film may minimize or at least reduce the penetration of moisture and oxygen present outside the first substrate 101 into the first substrate 101, thereby protecting the pixel part 120 including the light-emitting element. However, the barrier film may be eliminated in accordance with the implementation of the display device 100. However, the present disclosure is not limited thereto.

The seal member 141 is disposed to surround a side surface of the pixel part 120, a side surface of the bonding layer 130, and a side surface of the second substrate 140. The seal member 141 may be disposed in the non-display area NA and disposed to surround the pixel part 120 disposed in the display area AA. The seal member 141 will be described below in detail with reference to FIGS. 4 to 7C.

Hereinafter, the plurality of subpixels of the pixel part 120 will be described in more detail with reference to FIGS. 3 to 6B.

Figure 3:
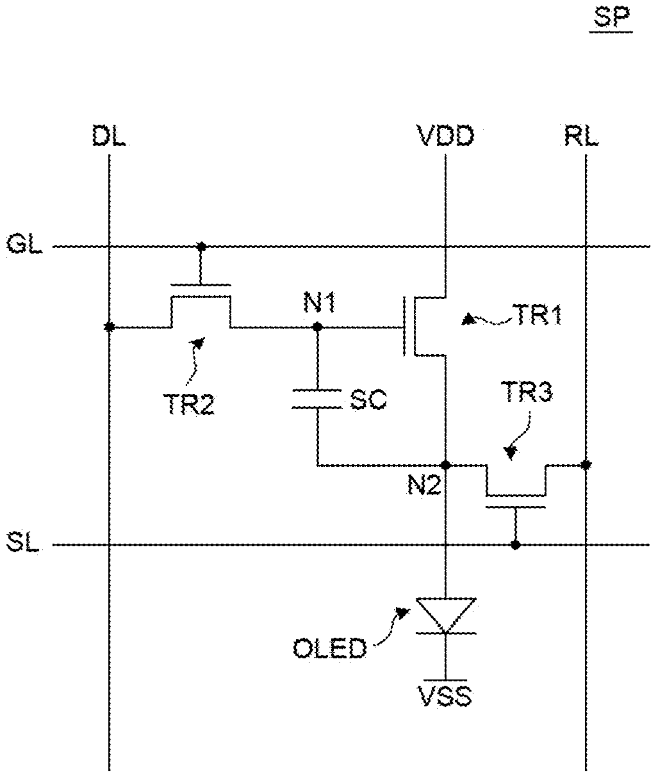
FIG. 3 is a circuit diagram of the subpixel of the display device according to an exemplary embodiment of the present disclosure.

FIG. 3 is a circuit diagram of the subpixel of the display device according to an exemplary embodiment of the present disclosure.

With reference to FIG. 3, a drive circuit for operating a light-emitting element OLED of each of a plurality of subpixels SP includes a first transistor TR1, a second transistor TR2, a third transistor TR3, and a storage capacitor SC. Further, a plurality of lines is disposed on the first substrate 101 to operate the drive circuit and includes a gate line GL, a data line DL, a high-potential power line VDD, a sensing line SL, and a reference line RL.

The first transistor TR1, the second transistor TR2, and the third transistor TR3, which are included in the drive circuit of the single subpixel SP, each include a gate electrode, a source electrode, and a drain electrode.

Further, the first transistor TR1, the second transistor TR2, and the third transistor TR3 may each be a P-type thin-film transistor or an N-type thin-film transistor. For example, in the P-type thin-film transistor, positive holes flow from the source electrode to the drain electrode, such that current may flow from the source electrode to the drain electrode. In the N-type thin-film transistor, electrons flow from the source electrode to the drain electrode, such that current may flow from the drain electrode to the source electrode. Hereinafter, the assumption is made that the first transistor TR1, the second transistor TR2, and the third transistor TR3 may each be the N-type thin-film transistor in which current flows from the drain electrode to the source electrode. However, the present disclosure is not limited thereto.

The first transistor TR1 includes a first gate electrode, a first source electrode, and a first drain electrode. The first gate electrode is connected to a first node N1. The first source electrode is connected to the anode of the light-emitting element OLED. The first drain electrode is connected to the high-potential power line VDD. The first transistor TR1 may be turned on when a voltage of the first node N1 is higher than a threshold voltage. The first transistor TR1 may be turned off when the voltage of the first node N1 is lower than the threshold voltage. Further, when the first transistor TR1 is turned on, drive current may be transmitted to the light-emitting element OLED through the first transistor TR1. Therefore, the first transistor TR1 configured to control the drive current to be supplied to the light-emitting element OLED may be referred to as a driving transistor.

The second transistor TR2 includes a second gate electrode, a second source electrode, and a second drain electrode. The second gate electrode is connected to the gate line GL. The second source electrode is connected to the first node N1. The second drain electrode is connected to the data line DL. The second transistor TR2 may be turned on or off on the basis of a gate voltage from the gate line GL. When the second transistor TR2 is turned on, the first node N1 may be charged with the data voltage from the data line DL. Therefore, the second transistor TR2 configured to be turned on or off by the gate line GL may be referred to as a switching transistor.

The third transistor TR3 includes a third gate electrode, a third source electrode, and a third drain electrode. The third gate electrode is connected to the sensing line SL. The third source electrode is connected to a second node N2. The third drain electrode is connected to the reference line RL. The third transistor TR3 may be turned on or off on the basis of a sensing voltage from the sensing line SL. Further, when the third transistor TR3 is turned on, a reference voltage may be transmitted from the reference line RL to the second node N2 and the storage capacitor SC. Therefore, the third transistor TR3 may be referred to as a sensing transistor.

Meanwhile, FIG. 3 illustrates that the gate line GL and the sensing line SL are separate lines. However, the gate line GL and the sensing line SL may be implemented as a single line. However, the present disclosure is not limited thereto.

The storage capacitor SC is connected between the first gate electrode and the first source electrode of the first transistor TR1. That is, the storage capacitor SC may be connected between the first node N1 and the second node N2. The storage capacitor SC may supply a predetermined drive current to the light-emitting element OLED by maintaining a potential difference between the first gate electrode and the first source electrode of the first transistor TR1 while the light-emitting element OLED emits light. The storage capacitor SC includes a plurality of capacitor electrodes. For example, one of the plurality of capacitor electrodes may be connected to the first node N1, and another capacitor electrode may be connected to the second node N2.

The light-emitting element OLED includes the anode, the light-emitting layer, and the cathode. The anode of the light-emitting element OLED is connected to the second node N2, and the cathode is connected to a low-potential power line VSS. The light-emitting element OLED may emit light by receiving the drive current from the first transistor TR1.

Meanwhile, FIG. 3 illustrates that the drive circuit of the subpixel SP of the display device 100 according to an exemplary embodiment of the present disclosure has a 3T1C structure including the three transistors and the single storage capacitor SC. However, the number of transistors, the number of storage capacitors SC, and a connection relationship between the transistor and the storage capacitor may be variously changed in accordance with design. The present disclosure is not limited thereto.

Figure 4:
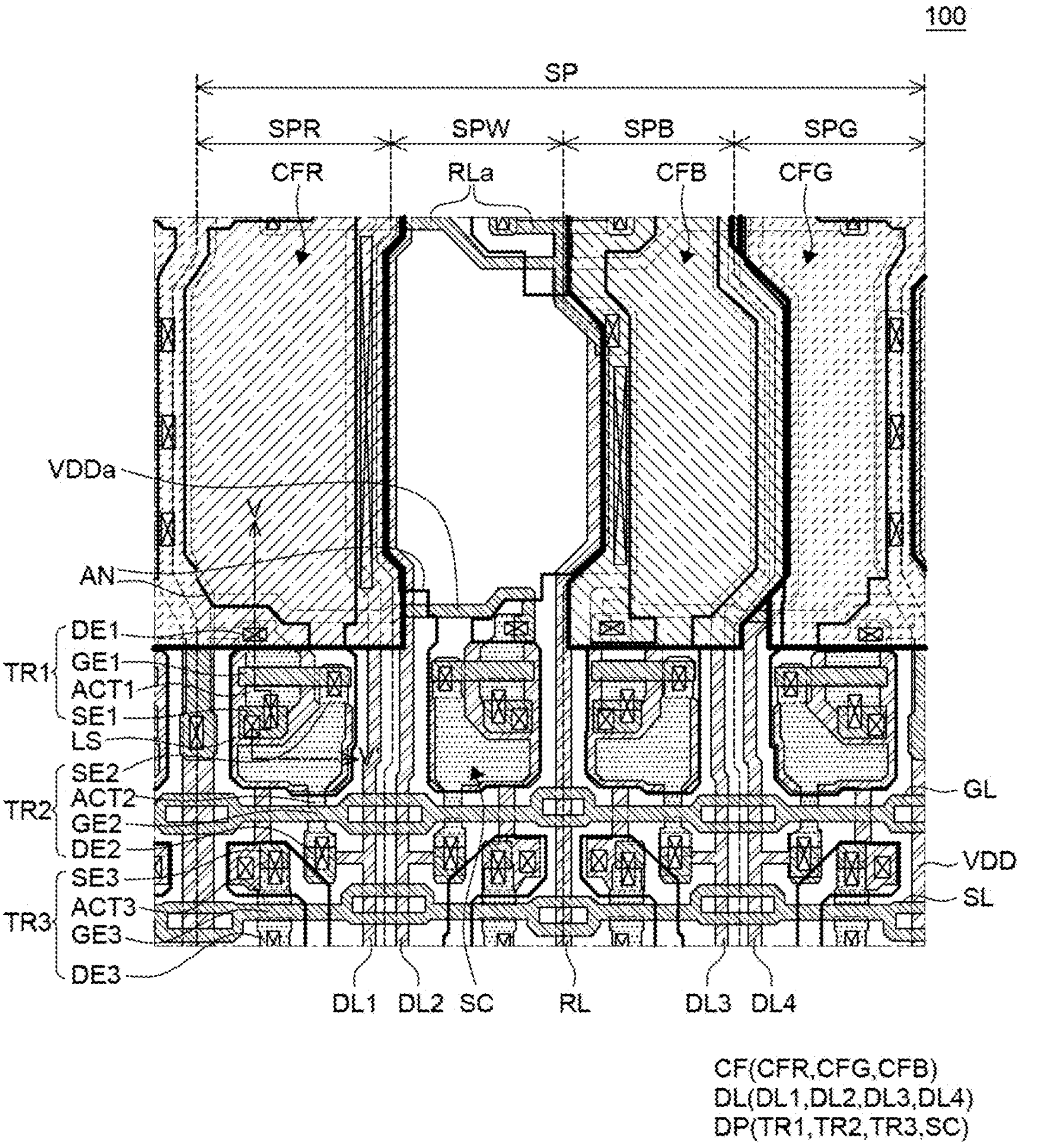
FIG. 4 is an enlarged top plan view of the display device according to an exemplary embodiment of the present disclosure.
Figure 5:
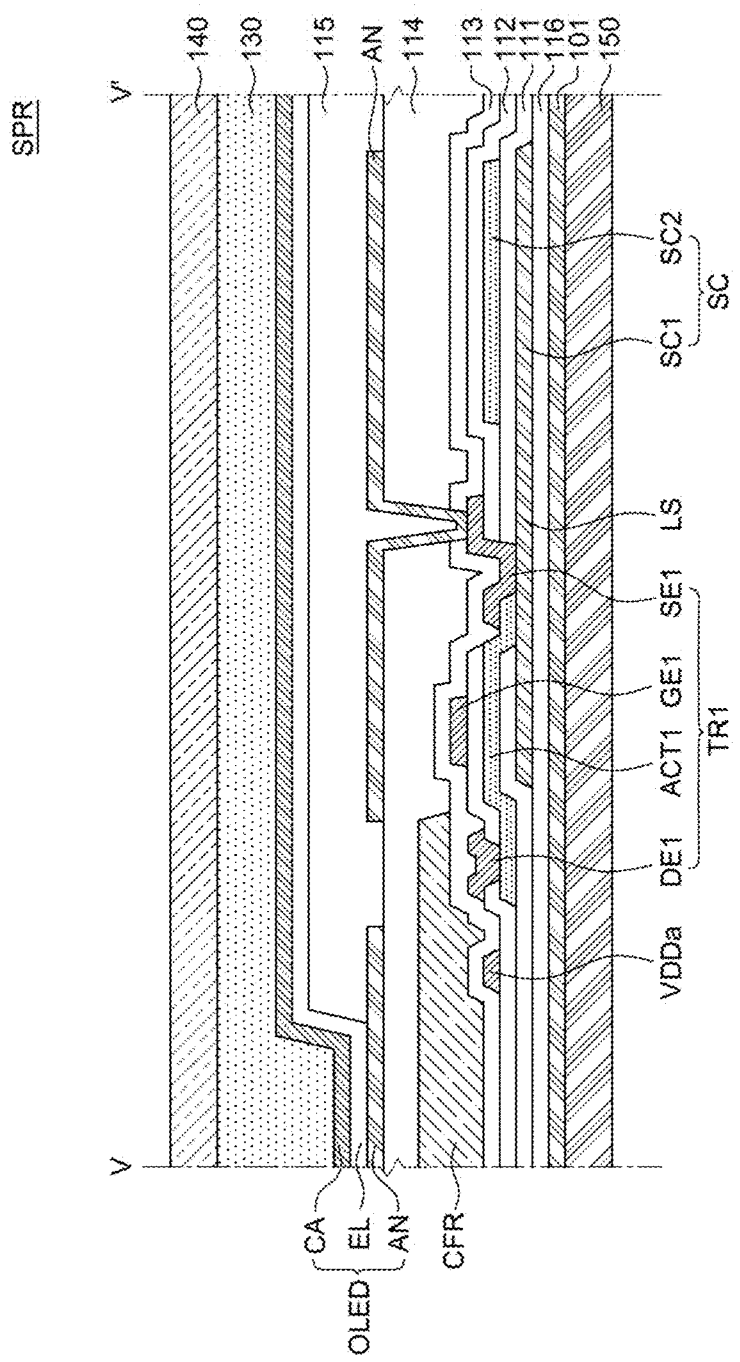
FIG. 5 is a cross-sectional view of the display device according to an exemplary embodiment of the present disclosure.
Figure 6A:
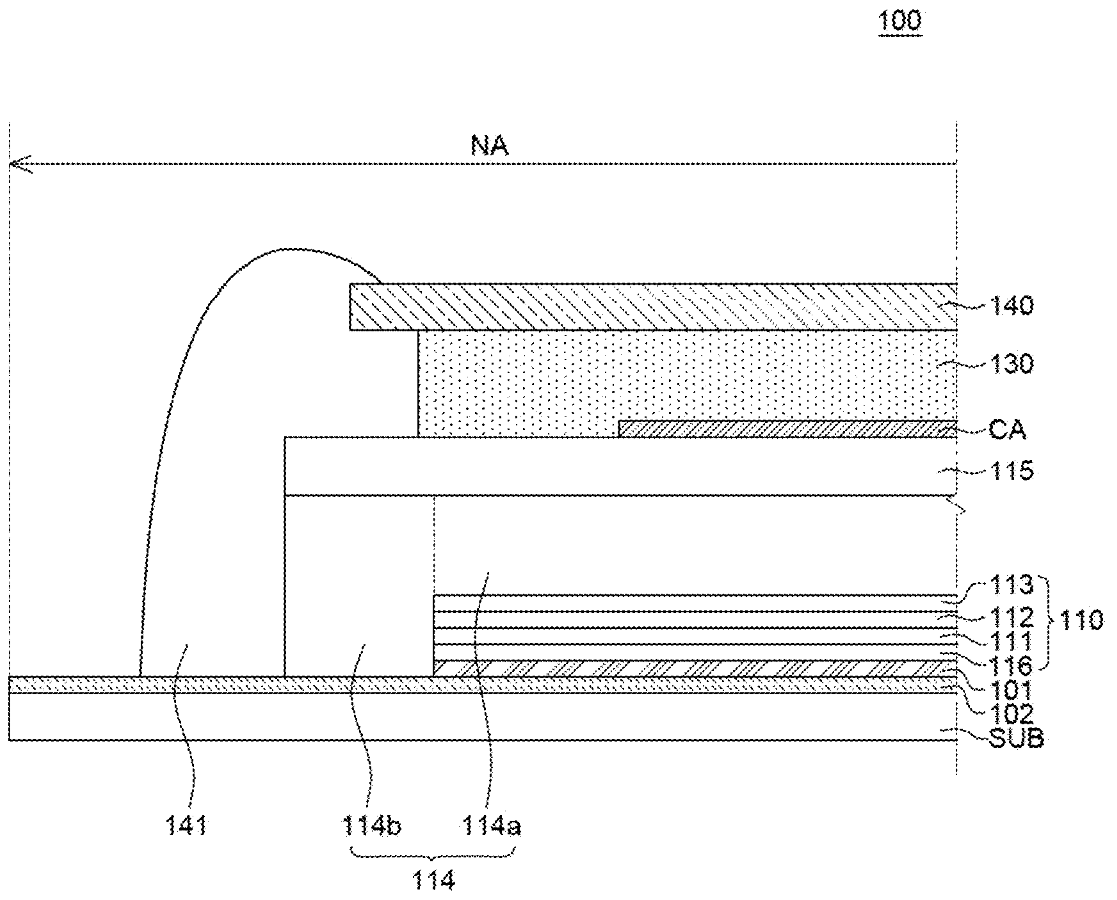
FIGS. 6A and 6B are cross-sectional views for explaining a process of manufacturing the display device according to an exemplary embodiment of the present disclosure.
Figure 6B:
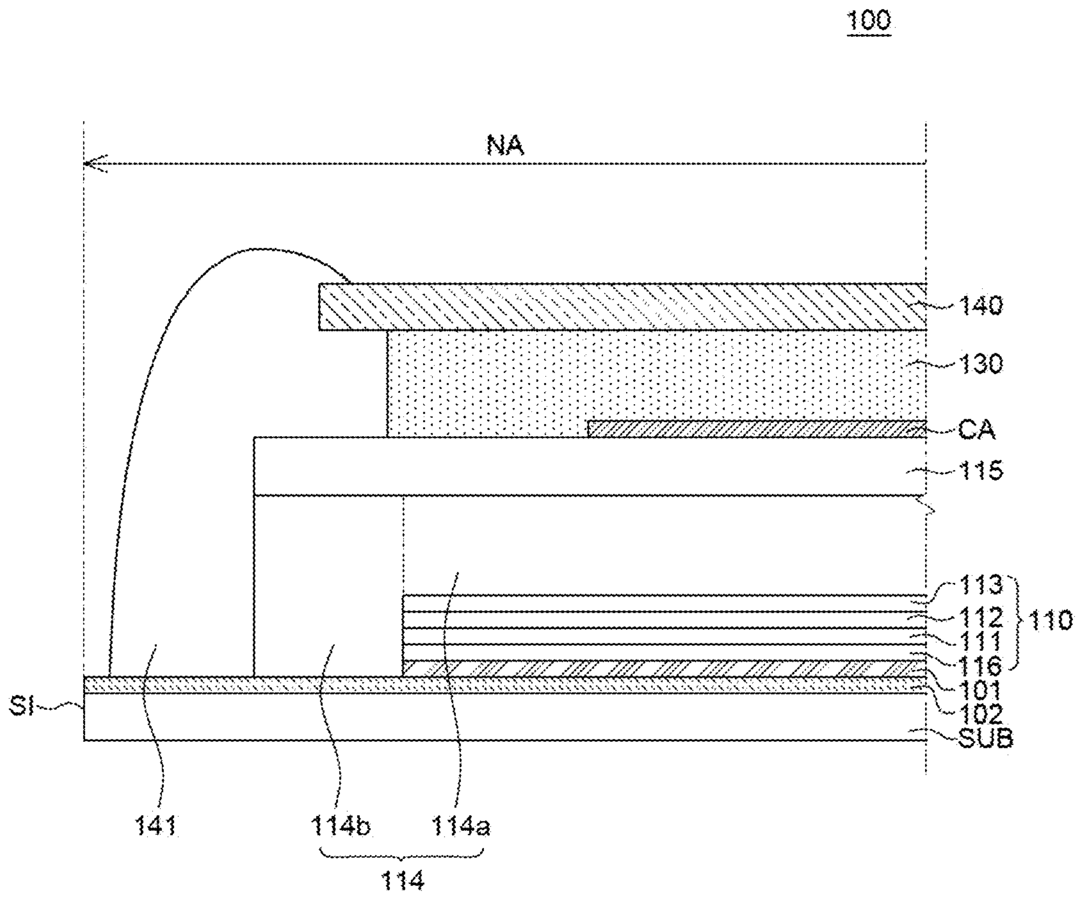
Figure 6C:
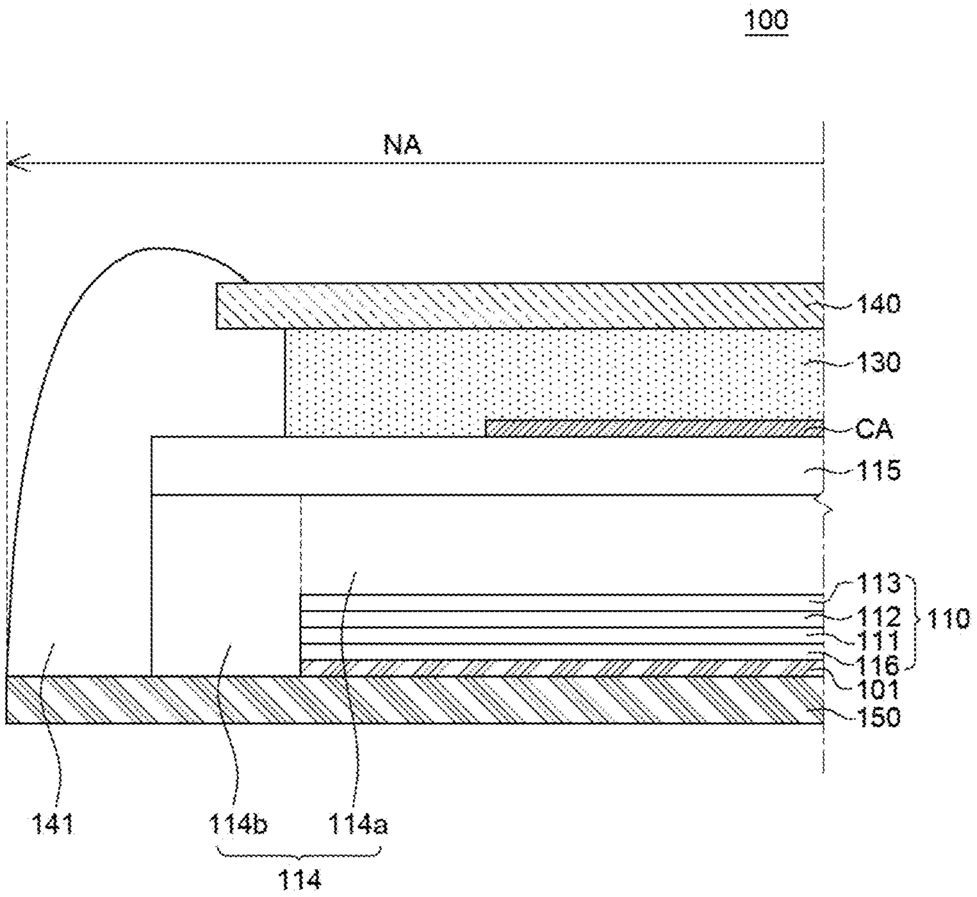
FIG. 6C is a cross-sectional view of the display device according to an exemplary embodiment of the present disclosure.

FIG. 4 is an enlarged top plan view of the display device according to an exemplary embodiment of the present disclosure. FIG. 5 is a cross-sectional view of the display device according to an exemplary embodiment of the present disclosure. FIGS. 6A and 6B are cross-sectional views for explaining a process of manufacturing the display device according to an exemplary embodiment of the present disclosure. FIG. 6C is a cross-sectional view of the display device according to an exemplary embodiment of the present disclosure.

FIG. 4 is an enlarged top plan view of a red subpixel SPR, a white subpixel SPW, a blue subpixel SPB, and a green subpixel SPG that constitute the single pixel. For convenience of description, FIG. 4 does not illustrate a bank 115, and rims of a plurality of color filters CF are indicated by bold solid line. FIGS. 6A to 6C are cross-sectional views taken along line V-V in FIG. 1, e.g., cross-sectional views corresponding to the non-display area NA in which the flexible film 160 is not disposed on the first substrate 101. FIG. 6A is a cross-sectional view illustrating a state made before a scribing process is performed. FIG. 6B is a cross-sectional view illustrating a state made after the scribing process is performed. FIG. 6C is a cross-sectional view illustrating a state made after a laser lift-off (LLO) process is performed. With reference to FIGS. 4 to 6C, the display device 100 may include the first substrate 101, the inorganic layer 110, the planarization layer 114, the bank 115, the first transistor TR1, the second transistor TR2, the third transistor TR3, the storage capacitor SC, the light-emitting element OLED, the gate line GL, the sensing line SL, the data line DL, the reference line RL, the high-potential power line VDD, the plurality of color filters CF, the bonding layer 130, the second substrate 140, and the seal member 141.

With reference to FIG. 4, the plurality of subpixels SP include the red subpixel SPR, the green subpixel SPG, the blue subpixel SPB, and the white subpixel SPW. For example, the red subpixel SPR, the white subpixel SPW, the blue subpixel SPB, and the green subpixel SPG may be sequentially disposed in a row direction. However, the arrangement order of the plurality of subpixels SP is not limited thereto.

The plurality of subpixels SP each include a light-emitting area and a circuit area. The light-emitting area is an area that may independently emit light with a single type of color. The light-emitting element OLED may be disposed in the light-emitting area. For example, the light-emitting area may be defined as an area exposed from the bank 115 and configured such that the light emitted from the light-emitting element OLED may propagate to the outside among the areas in which the plurality of color filters CF and the anode AN overlap one another. For example, with reference to FIGS. 4 and 5 together, the light-emitting area of the red subpixel SPR may be an area exposed from the bank 115 in an area in which a red color filter CFR and the anode AN overlap each other. The light-emitting area of the green subpixel SPG may be an area exposed from the bank 115 in an area in which a green color filter CFG and the anode AN overlap each other. The light-emitting area of the blue subpixel SPB may be a blue light-emitting area that emits blue light in an area exposed from the bank 115 in an area in which a blue color filter CF and the anode AN overlap each other. In this case, the light-emitting area of the white subpixel SPW in which no separate color filter CF is disposed may be a white light-emitting area that emits white light in an area that overlaps a part of the anode AN exposed from the bank 115.

The circuit area is an area except for the light-emitting area. A plurality of lines may be disposed in the circuit area and transmit various types of signals to a drive circuit DP and a drive circuit DP for operating the plurality of light-emitting elements OLED. Further, the circuit area in which the drive circuit DP, the plurality of lines, and the bank 115 are disposed may be a non-light-emitting area. For example, in the circuit area, there may be disposed the drive circuit DP including the first transistor TR1, the second transistor TR2, the third transistor TR3, and the storage capacitor SC, the plurality of high-potential power lines VDD, the plurality of data lines DL, the plurality of reference lines RL, a plurality of gate lines GL, the sensing line SL, and the bank 115.

With reference to FIGS. 3 to 6C, the inorganic layer 110 disposed on the first substrate 101. The inorganic layer 110 may include a plurality of layers disposed on the first substrate 101 and made of an inorganic material. For example, the inorganic layer 110 may include the lower buffer layer 116, the upper buffer layer 111, the gate insulation layer 112, and the passivation layr 113. However, the present disclosure is not limited thereto.

With reference to FIGS. 6A to 6C, an end of the inorganic layer 110 may be coincident with an end of the first substrate 101. However, the present disclosure is not limited thereto. The inorganic layer 110 may expose the end of the first substrate 101. For example, the end of the inorganic layer 110 may be disposed inward of the end of the first substrate 101.

The lower buffer layer 116 is disposed on the first substrate 101. The lower buffer layer 116 may inhibit moisture and/or oxygen penetrating from the outside of the first substrate 101 from being diffused. Moisture transmission properties of the display device 100 may be controlled by controlling a thickness or a layered structure of the lower buffer layer 116. In addition, the lower buffer layer 116 inhibits the first substrate 101 made of the transparent conducting oxide or oxide semiconductor from being short-circuited while coming into contact with other components, such as the pixel part 120. The lower buffer layer 116 may be made of an inorganic material, for example, configured as a single layer or a multilayer made of silicon oxide (SiOx) or silicon nitride (SiNx). However, the present disclosure is not limited thereto.

The plurality of high-potential power lines VDD, the plurality of data lines DL, the plurality of reference lines RL, and the light-blocking layer LS are disposed on the lower buffer layer 116.

The plurality of high-potential power lines VDD, the plurality of data lines DL, the plurality of reference lines RL, and the light-blocking layer LS may be disposed on the same layer on the first substrate 101 and made of the same electrically conductive material. For example, the plurality of high-potential power lines VDD, the plurality of data lines DL, the plurality of reference lines RL, and the light-blocking layer LS may each be made of an electrically conductive material, such as copper (Cu), aluminum (Al), molybdenum (Mo), nickel (Ni), titanium (Ti), chromium (Cr), or an alloy thereof. However, the present disclosure is not limited thereto.

The plurality of high-potential power lines VDD are lines for transmitting high power voltages to the plurality of subpixels SP. The plurality of high-potential power lines VDD may extend in the column direction between the plurality of subpixels SP. The two subpixels SP adjacent to each other in the row direction may share a single high-potential power line VDD among the plurality of high-potential power lines VDD. For example, one high-potential power line VDD may be disposed at the left side of the red subpixel SPR and supply the high-potential power voltage to the first transistor TR1 of each of the red subpixel SPR and the white subpixel SPW. The other high-potential power line VDD may be disposed at the right side of the green subpixel SPG and supply the high-potential power voltage to the first transistor TR1 of each of the blue subpixel SPB and the green subpixel SPG.

The plurality of data lines DL includes a first data line DL1, a second data line DL2, a third data line DL3 and a fourth data line DL4 which are lines that extend in the column direction between the plurality of subpixels SP and transmit the data voltages to the plurality of subpixels SP. The first data line DL1 may be disposed between the red subpixel SPR and the white subpixel SPW and transmit the data voltage to the second transistor TR2 of the red subpixel SPR. The second data line DL2 may be disposed between the first data line DL1 and the white subpixel SPW and transmit the data voltage to the second transistor TR2 of the white subpixel SPW. The third data line DL3 may be disposed between the blue subpixel SPB and the green subpixel SPG and transmit the data voltage to the second transistor TR2 of the blue subpixel SPB. The fourth data line DL4 may be disposed between the third data line DL3 and the green subpixel SPG and transmit the data voltage to the second transistor TR2 of the green subpixel SPG.

The plurality of reference lines RL are lines that extend in the column direction between the plurality of subpixels SP and transmit the reference voltage to the plurality of subpixels SP. The plurality of subpixels SP, which constitute a single pixel, may share the single reference line RL. For example, one reference line RL may be disposed between the white subpixel SPW and the blue subpixel SPB and transmit the reference voltage to the third transistor TR3 of each of the red subpixel SPR, the white subpixel SPW, the blue subpixel SPB, and the green subpixel SPG.

With reference to FIGS. 4 and 5, the light-blocking layer LS is disposed on the lower buffer layer 116. The light-blocking layer LS may overlap a first active layer ACT1 of at least the first transistor TR1 among the plurality of transistors TR1, TR2, and TR3 and inhibit the light from entering the first active layer ACT1. If the light is emitted to the first active layer ACT1, a leakage current occurs, which may degrade the reliability of the first transistor TR1 that is a driving transistor. In this case, when the light-blocking layer LS made of an opaque electrically conductive material, such as copper (Cu), aluminum (Al), molybdenum (Mo), nickel (Ni), titanium (Ti), chromium (Cr), or an alloy thereof overlapping the first active layer ACT1, the light-blocking layer LS may inhibit the light from entering the first active layer ACT1 from the lower side of the first substrate 101, thereby improving the reliability of the first transistor TR1. However, the present disclosure is not limited thereto. The light-blocking layer LS may overlap a second active layer ACT2 of the second transistor TR2 and a third active layer ACT3 of the third transistor TR3.

Meanwhile, the drawings illustrate that the light-blocking layer LS is a single layer. However, the light-blocking layer LS may be provided as a plurality of layers. For example, the light-blocking layer LS may be provided as a plurality of layers overlapping one another with the inorganic layer 110, e.g., at least any one of the lower buffer layer 116, the upper buffer layer 111, the gate insulation layer 112, and the passivation layer 113 interposed therebetween.

The upper buffer layer 111 is disposed on the plurality of high-potential power lines VDD, the plurality of data lines DL, the plurality of reference lines RL, and the light-blocking layer LS. The upper buffer layer 111 may reduce penetration of moisture or impurities through the first substrate 101. For example, the upper buffer layer 111 may be configured as a single layer or multilayer made of silicon oxide (SiOx) or silicon nitride (SiNx). However, the present disclosure is not limited thereto. In addition, the upper buffer layer 111 may be eliminated in accordance with the type of first substrate 101 or the type of transistor. However, the present specification is not limited thereto.

The first transistor TR1, the second transistor TR2, the third transistor TR3, and the storage capacitor SC are disposed on the upper buffer layer 111 of each of the plurality of subpixels SP.

The first transistor TR1 includes the first active layer ACT1, a first gate electrode GE1, a first source electrode SE1, and a first drain electrode DE1.

The first active layer ACT1 is disposed on the upper buffer layer 111. The first active layer ACT1 may be made of a semiconductor material, such as an oxide semiconductor, amorphous silicon, or polysilicon, but the present disclosure is not limited thereto. For example, in the case in which the first active layer ACT1 is made of an oxide semiconductor, the first active layer ACT1 may include a channel area, a source area, and a drain area. The source area and the drain area may be areas having conductivity. However, the present disclosure is not limited thereto.

The gate insulation layer 112 is disposed on the first active layer ACT1. The gate insulation layer 112 may be a layer for insulating the first gate electrode GE1 and the first active layer ACT1 and made of an insulating material. For example, the gate insulation layer 112 may be configured as a single layer or multilayer made of silicon oxide (SiOx) or silicon nitride (SiNx). However, the present disclosure is not limited thereto.

The first gate electrode GE1 is disposed on the gate insulation layer 112 so as to overlap the first active layer ACT1. The first gate electrode GE1 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The first source electrode SE1 and the first drain electrode DE1 are disposed on the gate insulation layer 112 and spaced apart from each other. The first source electrode SE1 and the first drain electrode DE1 may be electrically connected to the first active layer ACT1 through a contact hole formed in the gate insulation layer 112. The first source electrode SE1 and the first drain electrode DE1 may be disposed on the same layer and made of the same electrically conductive material as the first gate electrode GE1. However, the present disclosure is not limited thereto. For example, the first source electrode SE1 and the first drain electrode DE1 may be made of copper (Cu), aluminum (Al), molybdenum (Mo), nickel (Ni), titanium (Ti), chromium (Cr), or an alloy thereof. However, the present disclosure is not limited thereto.

The first drain electrode DE1 is electrically connected to the high-potential power line VDD. For example, the first drain electrodes DE1 of the red subpixel SPR and the white subpixel SPW may be electrically connected to the high-potential power line VDD at the left side of the red subpixel SPR. The first drain electrodes DE1 of the blue subpixel SPB and the green subpixel SPG may be electrically connected to the high-potential power line VDD at the right side of the green subpixel SPG.

In this case, to electrically connect the first drain electrode DE1 to the high-potential power line VDD, an auxiliary high-potential power line VDDa may be further disposed. The auxiliary high-potential power line VDDa has one end electrically connected to the high-potential power line VDD, and the other end electrically connected to the first drain electrode DE1 of each of the plurality of subpixels SP. For example, in a case in which the auxiliary high-potential power line VDDa is disposed on the same layer and may be made of the same material as the first drain electrode DE1, one end of the auxiliary high-potential power line VDDa may be electrically connected to the high-potential power line VDD through the contact hole formed in the gate insulation layer 112 and the upper buffer layer 111, and the other end of the auxiliary high-potential power line VDDa may extend to the first drain electrode DE1 and be integrated with the first drain electrode DE1.

In this case, the first drain electrode DE1 of the red subpixel SPR and the first drain electrode DE1 of the white subpixel SPW, which are electrically connected to the same high-potential power line VDD, may be connected to the same auxiliary high-potential power line VDDa. The first drain electrode DE1 of the blue subpixel SPB and the first drain electrode DE1 of the green subpixel SPG may also be connected to the same auxiliary high-potential power line VDDa. However, the first drain electrode DE1 and the high-potential power line VDD may be electrically connected by means of other methods. However, the present disclosure is not limited thereto.

The first source electrode SE1 may be electrically connected to the light-blocking layer LS through the contact hole formed in the gate insulation layer 112 and the upper buffer layer 111. In addition, a part of the first active layer ACT1 connected to the first source electrode SE1 may be electrically connected to the light-blocking layer LS through the contact hole formed in the upper buffer layer 111. If the light-blocking layer LS floats, the threshold voltage of the first transistor TR1 is changed, which may affect the operation of the display device 100. Therefore, the light-blocking layer LS may be electrically connected to the first source electrode SE1, such that the voltage may be applied to the light-blocking layer LS, and the operation of the first transistor TR1 is not affected. In the present specification, the configuration has been described in which both the first active layer ACT1 and the first source electrode SE1 are in contact with the light-blocking layer LS. However, only any one of the first source electrode SE1 and the first active layer ACT1 may be in direct contact with the light-blocking layer LS. The present disclosure is not limited thereto.

Meanwhile, FIG. 5 illustrates that the gate insulation layer 112 is formed on the entire surface of the first substrate 101. However, the gate insulation layer 112 may be patterned to overlap only the first gate electrode GE1, the first source electrode SE1, and the first drain electrode DE1. However, the present disclosure is not limited thereto.

The second transistor TR2 includes the second active layer ACT2, a second gate electrode GE2, a second source electrode SE2, and a second drain electrode DE2.

The second active layer ACT2 is disposed on the upper buffer layer 111. The second active layer ACT2 may be made of a semiconductor material, such as an oxide semiconductor, amorphous silicon, or polysilicon, but the present disclosure is not limited thereto. For example, in the case in which the second active layer ACT2 is made of an oxide semiconductor, the second active layer ACT2 may include a channel area, a source area, and a drain area. The source area and the drain area may be areas having conductivity. However, the present disclosure is not limited thereto.

The second source electrode SE2 is disposed on the upper buffer layer 111. The second source electrode SE2 may be integrated with and electrically connected to the second active layer ACT2. For example, the second source electrode SE2 may be formed by forming a semiconductor material on the upper buffer layer 111 and making a part of the semiconductor material conductive. Therefore, a portion of the semiconductor material, which does not become conductive, may be the second active layer ACT2. A portion of the semiconductor material, which becomes conductive, may be the second source electrode SE2. However, the second active layer ACT2 and the second source electrode SE2 may be separately formed. However, the present disclosure is not limited thereto.

The second source electrode SE2 is electrically connected to the first gate electrode GE1 of the first transistor TR1. The first gate electrode GE1 may be electrically connected to the second source electrode SE2 through the contact hole formed in the gate insulation layer 112. Therefore, the first transistor TR1 may be turned on or off in response to a signal from the second transistor TR2.

The gate insulation layer 112 is disposed on the second active layer ACT2 and the second source electrode SE2. The second drain electrode DE2 and the second gate electrode GE2 are disposed on the gate insulation layer 112.

The second gate electrode GE2 is disposed on the gate insulation layer 112 so as to overlap the second active layer ACT2. The second gate electrode GE2 may be electrically connected to the gate line GL. The second transistor TR2 may be turned on or off on the basis of the gate voltage transmitted to the second gate electrode GE2. The second gate electrode GE2 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

Meanwhile, the second gate electrode GE2 may extend from the gate line GL. For example, the second gate electrode GE2 may be integrated with the gate line GL. The second gate electrode GE2 and the gate line GL may be made of the same electrically conductive material. For example, the gate line GL may be made of copper (Cu), aluminum (Al), molybdenum (Mo), nickel (Ni), titanium (Ti), chromium (Cr), or an alloy thereof. However, the present disclosure is not limited thereto.

The gate line GL is a line for transmitting the gate voltages to the plurality of subpixels SP. The gate line GL may extend in the row direction while traversing a circuit area of the plurality of subpixels SP. The gate line GL may extend in the row direction and intersect the plurality of high-potential power lines VDD, the plurality of data lines DL, and the plurality of reference lines RL that extend in the column direction.

The second drain electrode DE2 is disposed on the gate insulation layer 112. The second drain electrode DE2 may be electrically connected to the second active layer ACT2 through the contact hole formed in the gate insulation layer 112. The second drain electrode DE2 may be electrically connected to one of the plurality of data lines DL through the contact hole formed in the gate insulation layer 112 and the upper buffer layer 111. For example, the second drain electrode DE2 of the red subpixel SPR may be electrically connected to the first data line DL1. The second drain electrode DE2 of the white subpixel SPW may be electrically connected to the second data line DL2. For example, the second drain electrode DE2 of the blue subpixel SPB may be electrically connected to the third data line DL3. The second drain electrode DE2 of the green subpixel SPG may be electrically connected to the fourth data line DL4. The second drain electrode DE2 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The third transistor TR3 includes the third active layer ACT3, a third gate electrode GE3, a third source electrode SE3, and a third drain electrode DE3.

The third active layer ACT3 is disposed on the upper buffer layer 111. The third active layer ACT3 may be made of a semiconductor material, such as an oxide semiconductor, amorphous silicon, or polysilicon, but the present disclosure is not limited thereto. For example, in the case in which the third active layer ACT3 is made of an oxide semiconductor, the third active layer ACT3 may include a channel area, a source area, and a drain area. The source area and the drain area may be areas having conductivity. However, the present disclosure is not limited thereto.

The gate insulation layer 112 is disposed on the third active layer ACT3. The third gate electrode GE3, the third source electrode SE3, and the third drain electrode DE3 are disposed on the gate insulation layer 112.

The third gate electrode GE3 is disposed on the gate insulation layer 112 so as to overlap the third active layer ACT3. The third gate electrode GE3 may be electrically connected to the sensing line SL. The third transistor TR3 may be turned on or off on the basis of the sensing voltage transmitted to the third transistor TR3. The third gate electrode GE3 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

Meanwhile, the third gate electrode GE3 may extend from the sensing line SL. For example, the third gate electrode GE3 may be integrated with the sensing line SL. The third gate electrode GE3 and the sensing line SL may be made of the same electrically conductive material. For example, the sensing line SL may be made of copper (Cu), aluminum (Al), molybdenum (Mo), nickel (Ni), titanium (Ti), chromium (Cr), or an alloy thereof. However, the present disclosure is not limited thereto.

The sensing line SL is a line that transmits the sensing voltages to the plurality of subpixels SP and extends in the row direction between the plurality of subpixels SP. For example, the sensing line SL may extend in the row direction at a boundary between the plurality of subpixels SP and intersect the plurality of high-potential power lines VDD, the plurality of data lines DL, and the plurality of reference lines RL that extend in the column direction.

The third source electrode SE3 may be electrically connected to the third active layer ACT3 through the contact hole formed in the gate insulation layer 112. The third source electrode SE3 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

Meanwhile, a part of the third active layer ACT3, which is in contact with the third source electrode SE3, may be electrically connected to the light-blocking layer LS through the contact hole formed in the upper buffer layer 111. For example, the third source electrode SE3 may be electrically connected to the light-blocking layer LS with the third active layer ACT3 interposed therebetween. Therefore, the third source electrode SE3 and the first source electrode SE1 may be electrically connected to each other through the light-blocking layer LS.

The third drain electrode DE3 may be electrically connected to the third active layer ACT3 through the contact hole formed in the gate insulation layer 112. The third drain electrode DE3 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The third drain electrode DE3 may be electrically connected to the reference line RL. For example, the third drain electrodes DE3 of the red subpixel SPR, the white subpixel SPW, the blue subpixel SPB, and the green subpixel SPG, which constitute the single pixel, may be electrically connected to the same reference line RL. For example, the plurality of subpixels SP, which constitutes a single pixel, may share the single reference line RL.

In this case, an auxiliary reference line RLa may transmit signals to the plurality of subpixels SP disposed side by side in the row direction through the reference line RL extending in the column direction. The auxiliary reference line RLa may extend in the row direction and electrically connect the reference line RL to the third drain electrode DE3 of each of the plurality of subpixels SP. One end of the auxiliary reference line RLa may be electrically connected to the reference line RL through the contact hole formed in the upper buffer layer 111 and the gate insulation layer 112. Further, the other end of the auxiliary reference line RLa may be electrically connected to the third drain electrode DE3 of each of the plurality of subpixels SP. In this case, the auxiliary reference line RLa may be integrated with the third drain electrode DE3 of each of the plurality of subpixels SP. The reference voltage may be transmitted from the reference line RL to the third drain electrode DE3 through the auxiliary reference line RLa. However, the auxiliary reference line RLa may be formed separately from the third drain electrode DE3. However, the present disclosure is not limited thereto.

The storage capacitor SC is disposed in the circuit area of each of the plurality of subpixels SP. The storage capacitor SC may store a voltage between the first gate electrode GE1 and the first source electrode SE1 of the first transistor TR1 so that the light-emitting element OLED may continuously maintain the same state during a single frame. The storage capacitor SC may include a first capacitor electrode SC1 and a second capacitor electrode SC2.

The first capacitor electrode SC1 is disposed between the lower buffer layer 116 and the upper buffer layer 111 in each of the plurality of subpixels SP. The first capacitor electrode SC1 may be disposed to be closest to the first substrate 101 among the conductive constituent elements disposed on the first substrate 101. The first capacitor electrode SC1 may be integrated with the light-blocking layer LS. The first capacitor electrode SC1 may be electrically connected to the first source electrode SE1 through the light-blocking layer LS.

The upper buffer layer 111 is disposed on the first capacitor electrode SC1. The second capacitor electrode SC2 is disposed on the upper buffer layer 111. The second capacitor electrode SC2 may overlap the first capacitor electrode SC1. The second capacitor electrode SC2 may be integrated with the second source electrode SE2 and electrically connected to the second source electrode SE2 or the first gate electrode GE1. For example, the second source electrode SE2 and the second capacitor electrode SC2 may be formed by forming a semiconductor material on the upper buffer layer 111 and making a part of the semiconductor material conductive. Therefore, a portion of the semiconductor material, which does not become conductive, may serve as the second active layer ACT2. A portion of the semiconductor material, which becomes conductive, may serve as the second source electrode SE2 or the second capacitor electrode SC2. Further, as described above, the first gate electrode GE1 is electrically connected to the second source electrode SE2 through the contact hole formed in the gate insulation layer 112. Therefore, the second capacitor electrode SC2 may be integrated with the second source electrode SE2 and electrically connected to the second source electrode SE2 and the first gate electrode GE1.

In summary, the first capacitor electrode SC1 of the storage capacitor SC may be integrated with the light-blocking layer LS and electrically connected to the light-blocking layer LS, the first source electrode SE1, and the third source electrode SE3. Further, the second capacitor electrode SC2 may be integrated with the second source electrode SE2 or the second active layer ACT2 and electrically connected to the second source electrode SE2 and the first gate electrode GE1. Therefore, the first capacitor electrode SC1 and the second capacitor electrode SC2, which overlap each other with the upper buffer layer 111 interposed therebetween, may maintain the light-emitting element OLED in the constant state by constantly maintaining the voltages of the first gate electrode GE1 and the first source electrode SE1 of the first transistor TR1 while the light-emitting element OLED emits light.

The passivation layer 113 is disposed on the first transistor TR1, the second transistor TR2, the third transistor TR3, and the storage capacitor SC. The passivation layer 113 is an insulation layer for protecting the components disposed below the passivation layer 113. For example, the passivation layer 113 may be configured as a single layer or multilayer made of silicon oxide (SiOx) or silicon nitride (SiNx). However, the present disclosure is not limited thereto. In addition, the passivation layer 113 may be excluded in accordance with the exemplary embodiments.

The plurality of color filters CF is disposed in the light-emitting area of each of the plurality of subpixels SP and provided on the passivation layer 113. As described above, the display device 100 according to an exemplary embodiment of the present disclosure is the bottom-emission type display device that allows the light emitted from the light-emitting element OLED to propagate to the lower sides of the light-emitting element OLED and the first substrate 101. Therefore, the plurality of color filters CF may be disposed below the light-emitting element OLED. The light emitted from the light-emitting element OLED may be implemented in the form of light beams with various colors by passing through the plurality of color filters CF.

The plurality of color filters CF includes the red color filter CFR, a blue color filter CFB, and the green color filter CFG. The red color filter CFR may be disposed in the light-emitting area of the red subpixel SPR among the plurality of subpixels SP. The blue color filter CFB may be disposed in the light-emitting area of the blue subpixel SPB. The green color filter CFG may be disposed in the light-emitting area of the green subpixel SPG.

The planarization layer 114 may be disposed on the passivation layer 113 and the plurality of color filters CF.

The planarization layer 114 is an insulation layer for flattening an upper portion of the first substrate 101 on which the first transistor TR1, the second transistor TR2, the third transistor TR3, the storage capacitor SC, the plurality of high-potential power lines VDD, the plurality of data lines DL, the plurality of reference lines RL, the plurality of gate lines GL, and the plurality of sensing lines SL are disposed. The planarization layer 114 may be configured as a single layer or multilayer made of an organic material, for example, an acrylic-based material. However, the present disclosure is not limited thereto.

Meanwhile, the planarization layer 114 may include a first planarization layer 114*a* and a second planarization layer 114*b*. The first planarization layer 114*a* and the second planarization layer 114*b* will be described in detail with reference to FIGS. 6A to 7C.

The light-emitting element OLED is disposed in the light-emitting area of each of the plurality of subpixels SP. The light-emitting element OLED is disposed on the planarization layer 114 of each of the plurality of subpixels SP. The light-emitting element OLED includes the anode AN, a light-emitting layer EL, and a cathode CA.

The anode AN is disposed on the planarization layer 114 in the light-emitting area. Because the anode AN supplies holes to the light-emitting layer EL, the anode AN may be made of an electrically conductive material having a high work function and may also be called an anode AN. For example, the anode AN may be made of a transparent electrically conductive material, such as indium tin oxide (ITO) or indium zinc oxide (IZO), but the present disclosure is not limited thereto.

Meanwhile, the anode AN may extend toward the circuit area. A part of the anode AN may extend from the light-emitting area toward the first source electrode SE1 of the circuit area and be electrically connected to the first source electrode SE1 through the contact hole formed in the planarization layer 114 and the passivation layer 113. Therefore, the anode AN of the light-emitting element OLED may extend to the circuit area and be electrically connected to the first source electrode SE1 of the first transistor TR1 or the second capacitor electrode SC2 of the storage capacitor SC.

The light-emitting layer EL is disposed on the anode AN in the light-emitting area and the circuit area. The light-emitting layer EL may be configured as a single layer over the plurality of subpixels SP. For example, the light-emitting layers EL of the plurality of subpixels SP may be connected to and integrated with one another. The light-emitting layer EL may be configured as a single light-emitting layer. The light-emitting layer EL may have a structure in which a plurality of light-emitting layers configured to emit light beams with different colors is stacked. The light-emitting layer EL may further include organic layers such as a hole injection layer, a hole transport layer, an electron transport layer, and an electron injection layer.

The cathode CA is disposed on the light-emitting layer EL in the light-emitting area and circuit area. Because the cathode CA supplies electrons to the light-emitting layer EL, the cathode CA may be made of an electrically conductive material having a low work function. The cathode CA may be configured as a single layer over the plurality of subpixels SP. For example, the cathodes CA of the plurality of subpixels SP may be connected to and integrated with one another. For example, the cathode CA may be made of an electrically transparent conductive material such as indium tin oxide (ITO) or indium zinc oxide (IZO) or made of an alloy of ytterbium (Yb). The cathode CA may further include a metal doping layer, but the present specification is not limited thereto. Meanwhile, although not illustrated in FIGS. 4 and 5, the cathode CA of the light-emitting element OLED may be electrically connected to the low-potential power line VSS and receive the low-potential power voltage.

The bank 115 is disposed between the anode AN and the light-emitting layer EL. The bank 115 overlap the display area AA and cover an edge of the anode AN. The bank 115 may be disposed at a boundary between the adjacent subpixels SP and reduce mixing of colors of the light beams emitted from the light-emitting element OLED of each of the plurality of subpixels SP. The bank 115 may be made of an insulating material. For example, the bank 115 may be made of polyimide-based resin, acryl-based resin, or benzocyclobutene (BCB)-based resin. However, the present disclosure is not limited thereto.

With reference to FIG. 6C, in the non-display area NA, the polarizing plate 150, the first substrate 101, the inorganic layer 110, the planarization layer 114, the bank 115, the cathode CA, the bonding layer 130, and the second substrate 140 are sequentially disposed. The seal member 141 is disposed on the side surface of the second substrate 140. The non-display area NA illustrated in FIG. 6C is the non-display area NA of the lateral portion of the first substrate 101 that excludes one side at which the flexible film 160 is disposed.

First, with reference to FIG. 6A for explaining the manufacturing process, a temporary substrate SUB is disposed on the lower portion of the first substrate 101. The temporary substrate SUB may have a larger area than the first substrate 101 to cover the bottom surface of the first substrate 101. The temporary substrate SUB is a substrate for supporting the first substrate 101 and the constituent elements disposed on the first substrate 101 during the process of manufacturing the display device 100. The temporary substrate SUB may be made of a material having rigidity. For example, the temporary substrate SUB may be made of glass. However, the present disclosure is not limited thereto.

A sacrificial layer 102 is disposed on the temporary substrate SUB. The sacrificial layer 102 is a layer formed to easily separate the temporary substrate SUB and the first substrate 101. Therefore, the sacrificial layer 102 may have a larger area than the first substrate 101 to cover the entire first substrate 101. The sacrificial layer 102 may have the same area as the temporary substrate SUB. The sacrificial layer 102 may be dehydrogenated by emitting laser beams to the sacrificial layer 102 from a lower side of the temporary substrate SUB, and the temporary substrate SUB, the sacrificial layer 102, and the first substrate 101 may be separated. For example, the sacrificial layer 102 may be made of hydrogenated amorphous silicon or amorphous silicon hydrogenated and doped with impurities.

The first substrate 101 is disposed on the sacrificial layer 102. The first substrate 101 may have a smaller area than the sacrificial layer 102 to be disposed inside the sacrificial layer 102, so that the first substrate 101 does not protrude beyond the sacrificial layer 102 in a direction parallel the sacrificial layer 102 and/or the first substrate 101.

The inorganic layer 110 is disposed on the first substrate 101.

An end of the inorganic layer 110 may be disposed in the non-display area NA and positioned on the same plane as an end of the first substrate 101. However, the present disclosure is not limited thereto. The end of the inorganic layer 110 may be positioned inside the end of the first substrate 101.

The planarization layer 114 is disposed on the temporary substrate SUB, the first substrate 101, and the inorganic layer 110. The planarization layer 114 is disposed to cover the entire surface of the first substrate 101. The end of the planarization layer 114 may be disposed in the non-display area NA and positioned outside the end of the first substrate 101 and the end of the inorganic layer 110.

Meanwhile, the planarization layer 114 may include the first planarization layer 114*a* and the second planarization layer 114*b*. The first planarization layer 114*a* and the second planarization layer 114*b* may be integrated and made of the same material. For example, the first planarization layer 114*a* and the second planarization layer 114*b* may be formed simultaneously by the same process.

The first planarization layer 114*a* is disposed in an area that overlaps the first substrate 101. For example, the first planarization layer 114*a* may be partially disposed in the display area AA and the non-display area NA and disposed to overlap the first substrate 101 and the inorganic layer 110. Therefore, the planarization layer 114 illustrated in FIG. 5 may correspond to the first planarization layer 114*a*.

The second planarization layer 114*b* may be disposed in an area that does not overlap the first substrate 101. For example, as illustrated in FIG. 6A, the second planarization layer 114*b* may adjoin the sacrificial layer 102. Therefore, the second planarization layer 114*b* may surround side surfaces of the first planarization layer 114*a*, the inorganic layer 110, and the first substrate 101.

The bank 115 is disposed on the temporary substrate SUB, the first substrate 101, the inorganic layer 110, and the planarization layer 114. An end of the bank 115 may be disposed in the non-display area NA and positioned on the same plane as an end of the second planarization layer 114*b*. However, the present disclosure is not limited thereto. The end of the bank 115 may be positioned inside the end of the second planarization layer 114*b*.

The cathode CA, the bonding layer 130, and the second substrate 140 may be disposed on the bank 115. The end of the bonding layer 130 may be positioned on top surfaces of the planarization layer 114 and the bank 115. For example, the end of the second planarization layer 114*b* may be positioned outside the end of the bonding layer 130. In addition, the second substrate 140 may adjoin the top surface of the bonding layer 130. Therefore, the ends of the first substrate 101 and the inorganic layer 110 may be disposed inside the end of the bonding layer 130.

The seal member 141 may surround a side surface of the second substrate 140. An end of the seal member 141 may be disposed outside the end of the second planarization layer 114*b* so that the seal member 141 may cover the end of the second planarization layer 114*b*. The seal member 141 may be configured as a single layer or multilayer made of an organic material, for example, an acrylic-based material.

Next, a scribing process may be performed to scribe the temporary substrate SUB into units used for the display devices 100. With reference to FIG. 6B, the temporary substrate SUB and some of the components disposed on the temporary substrate SUB may be removed by the scribing process. For example, the sacrificial layer 102 and the temporary substrate SUB disposed outside the seal member 141 may be partially removed. Therefore, a cut surface S1 may be formed on the temporary substrate SUB. In this case, the cut surface S1, which is formed after the scribing process, may further protrude to the outside than the end of the seal member 141. For example, the end of the seal member 141 may be disposed inside the ends of the temporary substrate SUB and the sacrificial layer 102. The end of the second planarization layer 114*b*, the end of the first substrate 101, and the end of the inorganic layer 110 may be disposed inside the end of the seal member 141.

Next, the first substrate 101 and the temporary substrate SUB may be separated by the LLO process. The sacrificial layer 102 may be made of hydrogenated amorphous silicon or amorphous silicon hydrogenated and doped with impurities. When the laser beams are emitted toward the temporary substrate SUB and the sacrificial layer 102 from the lower side of the temporary substrate SUB, the sacrificial layer 102 may be dehydrogenated, and the sacrificial layer 102 and the temporary substrate SUB may be separated from the first substrate 101.

Further, in the LLO process, the first substrate 101, the second planarization layer 114*b*, and the seal member 141 may be separated from the temporary substrate SUB. Therefore, an end of the second planarization layer 114*b* and the seal member 141 may be provided outside the first substrate 101 and disposed on the same layer as the first substrate 101.

Next, with reference to FIG. 6C, the polarizing plate 150 is disposed on lower portions of the second planarization layer 114*b*, the first substrate 101, and the seal member 141. However, the present disclosure is not limited thereto. A barrier film or bonding agent may be disposed on a bottom surface of the first substrate 101, a bottom surface of the second planarization layer 114*b*, and a bottom surface of the seal member 141.

The second planarization layer 114*b* may be disposed in the non-display area NA and surround the first planarization layer 114*a*, the inorganic layer 110, and the first substrate 101. The second planarization layer 114*b* may be disposed in an area of the non-display area NA that excludes an area in which the flexible film 160 is disposed. The seal member 141 may be disposed in the non-display area NA and surround the second planarization layer 114*b*, the bonding layer 130, and the second substrate 140.

Hereinafter, the non-display area NA in which the flexible film 160 is disposed will be described with reference to FIGS. 7A to 7C.

Figure 7A:
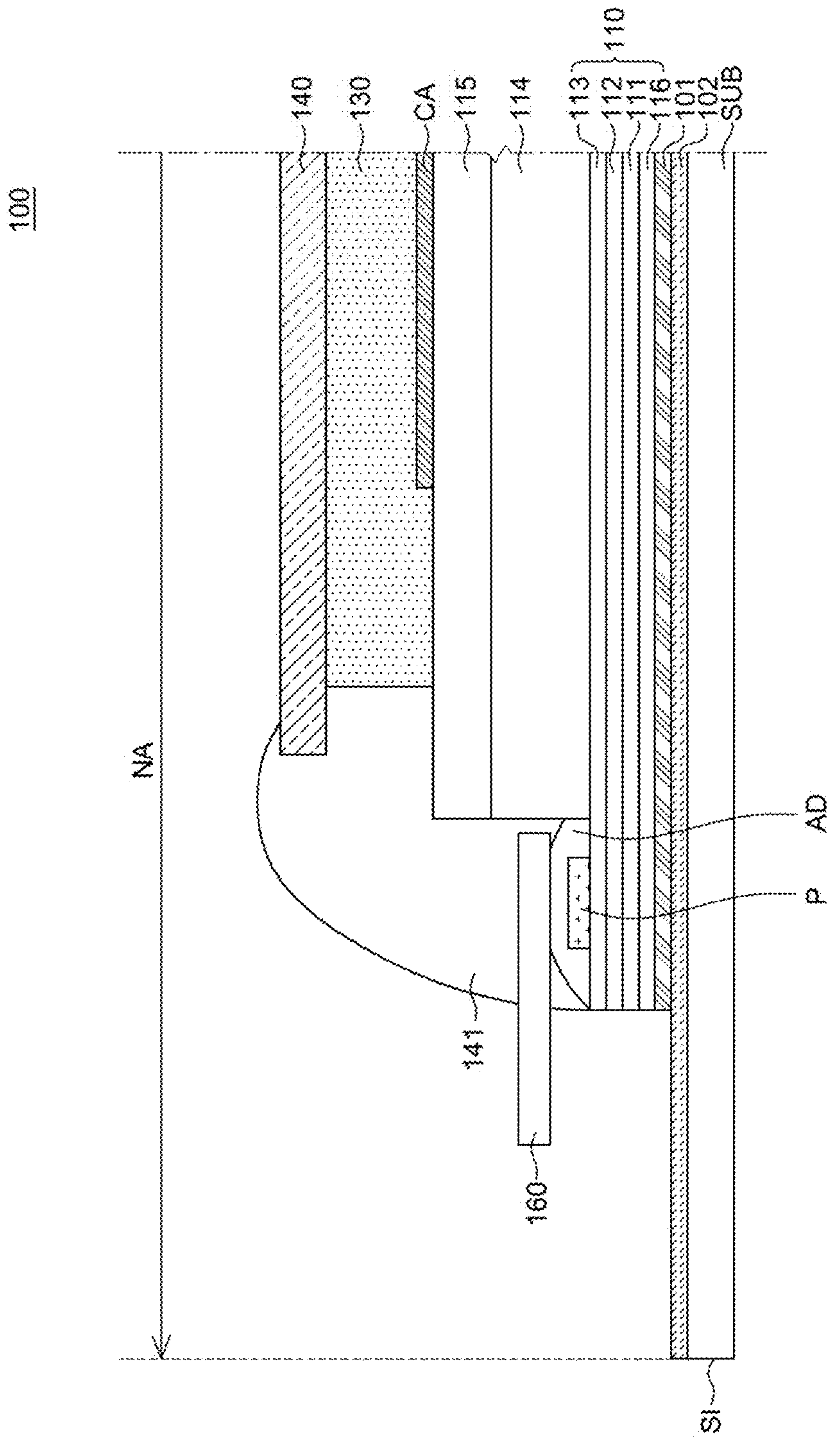
FIGS. 7A and 7B are cross-sectional views for explaining a process of manufacturing the display device according to an exemplary embodiment of the present disclosure.
Figure 7B:
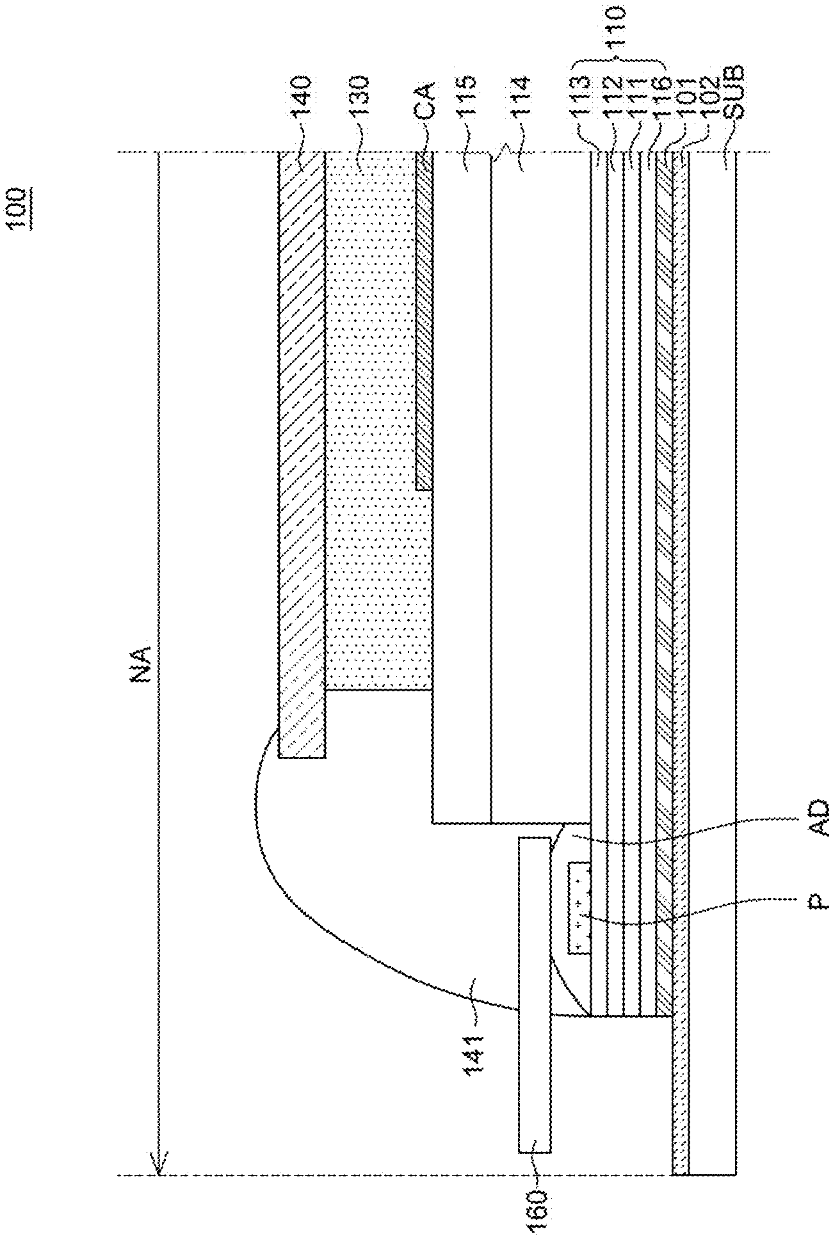

FIGS. 7A and 7B are cross-sectional views for explaining a process of manufacturing the display device according to an exemplary embodiment of the present disclosure. FIG. 7C is a cross-sectional view of the display device according to an exemplary embodiment of the present disclosure. FIGS. 7A to 7C are cross-sectional views taken along line VII-VII' in FIG. 1, e.g., cross-sectional views corresponding to the non-display area NA in which the flexible film 160 is disposed on the first substrate 101. FIG. 7A is a cross-sectional view illustrating a state made before the scribing process is performed during the process of manufacturing the display device 100. FIG. 7B is a cross-sectional view illustrating a state made after the scribing process is performed, and FIG. 7C is a cross-sectional view illustrating a made after the LLO process is performed.

Figure 7C:
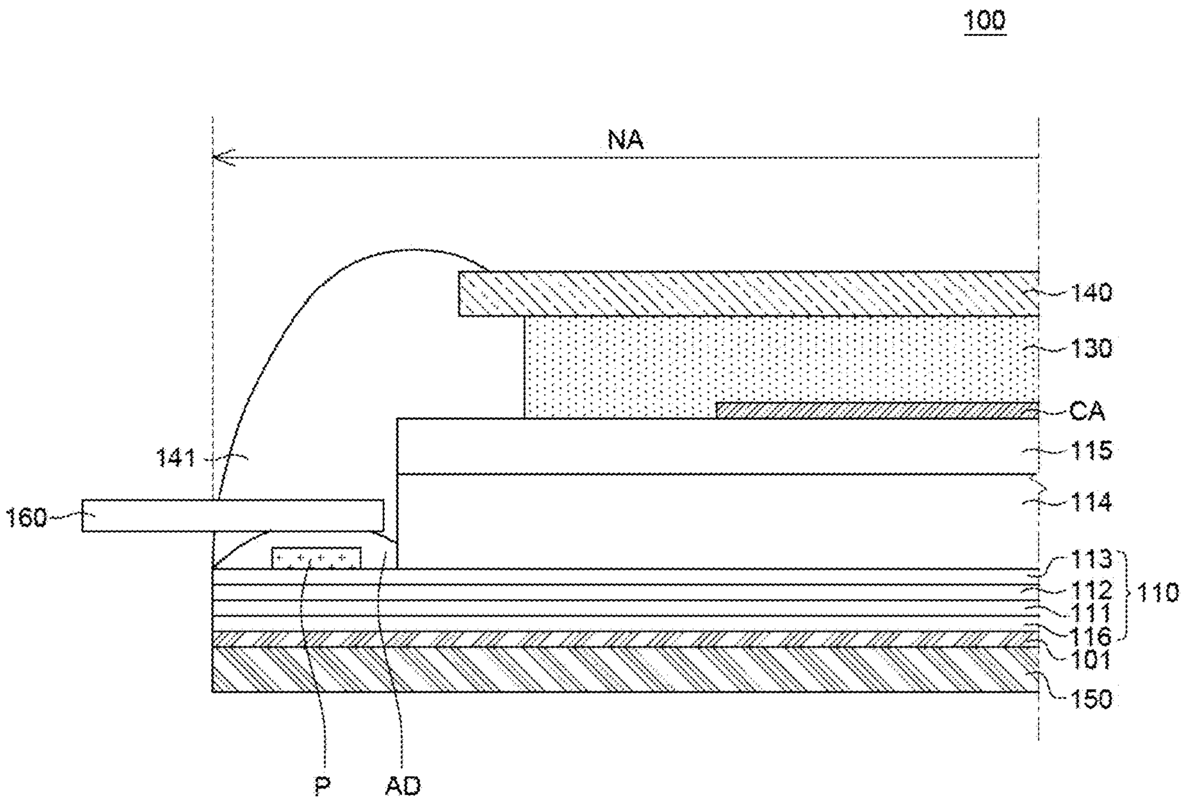
FIG. 7C is a cross-sectional view of the display device according to an exemplary embodiment of the present disclosure.

The non-display area NA illustrated in FIG. 7C is the non-display area NA of the first substrate 101 in which the flexible film 160 is disposed. With reference to FIG. 7C, in the non-display area NA, the polarizing plate 150, the first substrate 101, the flexible film 160, the inorganic layer 110, the planarization layer 114, the bank 115, the cathode CA, the bonding layer 130, and the second substrate 140 are sequentially disposed. The seal member 141 and a bonding member AD are disposed on the side surface of the second substrate 140.

First, with reference to FIG. 7A for explaining the manufacturing process, the temporary substrate SUB is disposed on the lower portion of the first substrate 101. The temporary substrate SUB may have a larger area than the first substrate 101 to cover the bottom surface of the first substrate 101.

The sacrificial layer 102 is disposed on the temporary substrate SUB. The sacrificial layer 102 may have a larger area than the first substrate 101 to cover the entire first substrate 101. The sacrificial layer 102 may have the same area as the temporary substrate SUB.

The first substrate 101 is disposed on the sacrificial layer 102. The first substrate 101 may have a smaller area than the sacrificial layer 102 to be disposed inside the sacrificial layer 102, so as not to protrude beyond the sacrificial layer 102 in a direction parallel to the sacrificial layer 102 and/or the first substrate 101.

The inorganic layer 110 is disposed on the first substrate 101.

The end of the inorganic layer 110 may be disposed in the non-display area NA and positioned on the same plane as the end of the first substrate 101, e.g. such that the end of the inorganic layer 101 and of the first substrate 110 are aligned (e.g. flush) with each other, i.e. at a same distance from the display area AA, or the end of the inorganic layer 110 may be positioned closer to the display area AA than the end of the first substrate 101.

The planarization layer 114 is disposed on the temporary substrate SUB, the first substrate 101, and the inorganic layer 110.

Only the first planarization layer 114*a*, which is an area of the planarization layer 114 that overlaps the first substrate 101, may be disposed in the non-display area NA in which the flexible film 160 is disposed.

The bank 115 is disposed on the temporary substrate SUB, the first substrate 101, the inorganic layer 110, and the planarization layer 114. The end of the bank 115 may be disposed in the non-display area NA and positioned on the same plane as the end of the planarization layer 114 or positioned inside the end of the planarization layer 114.

The cathode CA, the bonding layer 130, and the second substrate 140 may be disposed on the bank 115. The end of the planarization layer 114 may be positioned outside the end of the bonding layer 130. In addition, the second substrate 140 may adjoin the top surface of the bonding layer 130. In this case, the ends of the first substrate 101 and the inorganic layer 110 may be disposed outside the end of the bonding layer 130.

A plurality of pads P may be disposed on the first substrate 101 and the inorganic layer 110. The plurality of pads P is electrodes for electrically connecting the plurality of flexible films 160 and the plurality of subpixels SP. The signals from the printed circuit board 170 and the plurality of flexible films 160 may be transmitted to the plurality of subpixels SP in the display area AA through the plurality of pads P.

Meanwhile, although not illustrated in FIGS. 7A to 7C, a link line may be disposed on the first substrate 101. The link line may be electrically connected to the plurality of pads P and transmit the signals from the plurality of pads P to the plurality of subpixels SP in the display area AA.

The plurality of flexible films 160 may be disposed on the plurality of pads P. One end of each of the plurality of flexible films 160 may be electrically connected to the plurality of pads P. In this case, the plurality of flexible films 160 and the plurality of pads P may be electrically connected by the bonding member AD.

The bonding member AD may be a conductive bonding layer containing conductive particles. For example, the bonding member AD may be an anisotropic conductive film (ACF). However, the present disclosure is not limited thereto.

The seal member 141 is disposed on the side surface of the second substrate 140. The seal member 141 is disposed to cover one end of the flexible film 160 disposed on the top surface of the substrate 101. The end of the seal member 141 may be disposed outside the end of the planarization layer 114 so that the seal member 141 may cover the end of the planarization layer 114. The seal member 141 may be configured as a single layer or multilayer made of an organic material, for example, an acrylic-based material.

Next, the scribing process may be performed to scribe the temporary substrate SUB into units used for the display devices 100. With reference to FIG. 7B, the scribing process may remove the temporary substrate SUB and some of the components disposed on the upper portion of the temporary substrate SUB, for example, partially remove the sacrificial layer 102 and the temporary substrate SUB disposed outside the flexible film 160. In this case, the cut surface S1, which is formed after the scribing process, may further protrude to the outside than the end of the seal member 141.

The end of the seal member 141 may be disposed inside the ends of the temporary substrate SUB and the sacrificial layer 102. The end of the planarization layer 114, the end of the first substrate 101, and the end of the inorganic layer 110 may be disposed inside the end of the seal member 141.

Next, the first substrate 101 and the temporary substrate SUB may be separated by the LLO process.

Further, in the LLO process, the first substrate 101 and the seal member 141 may be separated from the temporary substrate SUB. Next, with reference to FIG. 7C, the polarizing plate 150 is disposed on a lower portion of the first substrate 101. However, the present disclosure is not limited thereto. A barrier film or bonding agent may be disposed on the bottom surface of the first substrate 101.

The first substrate 101 of the display device 100 may be made of any one of the transparent conducting oxide and the oxide semiconductor. Therefore, the display device 100 may decrease in thickness. In the related art, a plastic substrate is mainly used for a substrate of a display device. However, because the plastic substrate is formed by applying and curing a substrate material at a high temperature, there is a problem in that a large amount of time is required, and it is difficult to reduce a thickness to a predetermined level or less. In contrast, the transparent conducting oxide or the oxide semiconductor may allow the display device to have a very small thickness through a deposition process such as sputtering. Therefore, in the display device 100, the first substrate 101 for supporting several components of the display device 100 may be made of the transparent conducting oxide layer or oxide semiconductor layer. Therefore, it is possible to reduce a thickness of the display device 100 and implement slim design.

In addition, in the display device 100 according to an exemplary embodiment of the present disclosure, the first substrate 101 is made of the transparent conducting oxide or oxide semiconductor, such that it is possible to improve the flexibility of the display device 100 or reduce stress caused by the deformation of the display device 100. For example, when the first substrate 101 is made of the transparent conducting oxide layer or oxide semiconductor, the first substrate 101 may be formed to have a very thin film. In this case, the first substrate 101 may be referred to as a first transparent thin-film layer. Therefore, the display device 100 including the first substrate 101 may have high flexibility. Therefore, the display device 100 may be easily curved or rolled up. Therefore, in the display device 100 according to an exemplary embodiment of the present disclosure, the first substrate 101 is made of any one of the transparent conducting oxide layer and the oxide semiconductor layer, such that it is possible to improve flexibility of the display device 100 and reduce stress caused by the deformation of the display device 100. Therefore, it is possible to reduce cracks formed in the display device 100.

In addition, in the display device 100 according to an exemplary embodiment of the present disclosure, the first substrate 101 may be made of any one of the transparent conducting oxide layer and the oxide semiconductor layer, thereby reducing the likelihood that the static electricity occurs on the first substrate 101. If the first substrate 101 is made of plastic and the static electricity occurs, various types of lines and driving elements on the first substrate 101 may be damaged by the static electricity, or the static electricity may affect the operations of the lines and components, which may deteriorate the display quality. Instead, the first substrate 101 is made of the transparent conducting oxide layer or oxide semiconductor layer, it is possible to minimize or at least reduce the static electricity occurring on the first substrate 101 and simplify the configuration for blocking and discharging the static electricity. Therefore, in the display device 100, the first substrate 101 is made of any one of the transparent conducting oxide layer and oxide semiconductor layer that is low in the likelihood of the occurrence of the static electricity. Therefore, it is possible to reduce damage or deterioration in display quality caused by the static electricity.

In addition, in the display device 100, the first substrate 101 may be made of one of the transparent conducting oxide and the oxide semiconductor. Therefore, it is possible to minimize or at least reduce the penetration of outside moisture or oxygen into the display device 100 through the first substrate 101. When the first substrate 101 is made of the transparent conducting oxide layer or oxide semiconductor layer, the first substrate 101 is formed in a vacuum environment, such that the likelihood of the occurrence of particles is remarkably low. In addition, sizes of the particles are very small even though the particles occur. Therefore, it is possible to minimize or at least reduce the penetration of moisture and oxygen into the display device 100. Therefore, in the display device 100 according to an exemplary embodiment of the present disclosure, the first substrate 101 is made of the transparent conducting oxide or oxide semiconductor that decreases the likelihood of the occurrence of particles and is excellent in moisture transmission performance. Therefore, it is possible to improve reliability of the display device 100 and the light-emitting element OLED including the organic layer.

In addition, in the display device 100 according to an exemplary embodiment of the present disclosure, the first substrate 101 is made of any one of the transparent conducting oxide and the oxide semiconductor. Further, the first substrate 101 may be used in a state in which a thin, inexpensive barrier film is attached to a lower portion of the substrate 110. In a case in which the first substrate 101 is made of a material, for example, a plastic material having low moisture transmission performance, the moisture transmission performance may be improved by attaching the thick, expensive barrier film having high performance. However, in the display device 100 according to an exemplary embodiment of the present disclosure, the first substrate 101 is made of the transparent conducting oxide or oxide semiconductor that is excellent in moisture transmission performance. Therefore, the thin, inexpensive barrier film may be attached to the lower portion of the first substrate 101. Therefore, in the display device 100 according to an exemplary embodiment of the present disclosure, the first substrate 101 is made of any one of the transparent conducting oxide and the oxide semiconductor that are excellent in moisture transmission performance. Therefore, it is possible to reduce manufacturing costs for the display device 100.

In addition, in the display device 100 according to an exemplary embodiment of the present disclosure, the first substrate 101 is made of any one of the transparent conducting oxide and the oxide semiconductor. Therefore, it is possible to perform a laser-lift-off (LLO) process. During the process of manufacturing the display device 100, the pixel part 120 may be formed on the first substrate 101 by attaching the temporary substrate SUB having a sacrificial layer to a lower portion of the first substrate 101. The sacrificial layer may be made of, for example, hydrogenated amorphous silicon or amorphous silicon hydrogenated and doped with impurities. Further, when laser beams are emitted to the lower portion of the temporary substrate SUB after the display device 100 is completely manufactured, the sacrificial layer may be dehydrogenated, and the sacrificial layer and the temporary substrate SUB may be separated from the first substrate 101. In this case, the transparent conducting oxide or the oxide semiconductor are the materials that may be subjected to the LLO process together with the sacrificial layer and the temporary substrate SUB. Therefore, even though the first substrate 101 is made of any one of the transparent conducting oxide and the oxide semiconductor, the first substrate 101 and the temporary substrate SUB may be easily separated. Therefore, in the display device 100 according to an exemplary embodiment of the present disclosure, the first substrate 101 is made of one of the transparent conducting oxide layer and the oxide semiconductor that may be subjected to the LLO process. Therefore, it is possible to easily manufacture the display device 100 even using a process and an apparatus in the related art.

Meanwhile, as described above, in case that the first substrate made of one of the transparent conducting oxide layer and the oxide semiconductor, the first substrate may be disposed in the entire area of the display device to perform the LLO process. For example, the first substrate may be disposed on the entire display area and the entire non-display area of the display device. In this case, the first substrate and the inorganic layer may extend to an outermost peripheral area of the display device. However, as described above, in case that the first substrate and the inorganic layer are disposed in the outermost peripheral area, the first substrate and the inorganic layer may be easily cracked and damaged by external impact.

In addition, if an external force is applied to a boundary of the second substrate having relatively high rigidity, the first substrate and the inorganic layer may be cracked and damaged in the area corresponding to the boundary of the second substrate. For this reason, the reliability of the display device may deteriorate.

In the display device 100 according to an exemplary embodiment of the present disclosure, the planarization layer 114 includes the second planarization layer 114*b* disposed to surround the side surfaces of the inorganic layer 110 and the first substrate 101. In addition, the seal member 141 is disposed to surround side surfaces of the first substrate 101, the inorganic layer 110, the pixel part 120, the bonding layer 130, and the second substrate 140. Therefore, in the display device 100 according to an exemplary embodiment of the present disclosure, the first substrate 101 and the inorganic layer 110 may not be disposed on the outer peripheral portion of the display device 100, and the planarization layer 114 and the seal member 141 may protect the ends of the first substrate 101 and the inorganic layer 110. Therefore, the planarization layer 114 and the seal member 141 may each serve as a bumper in the event of a lateral collision, thereby improving the rigidity of the side surface. In addition, the first substrate 101 and the inorganic layer 110 may not be disposed in the area corresponding to the boundary of the second substrate 140. Therefore, the first substrate 101 and the inorganic layer 110 may not be damaged or cracked by impact applied from the outside of the display device 100 and stress applied to the boundary of the second substrate 140. Therefore, in the display device 100 according to an exemplary embodiment of the present disclosure, it is possible to improve reliability and reduce a defective operation caused by a cracks.

Meanwhile, the scribing process of cutting the display device into cell units is performed during the process of manufacturing the display device. Defects such as fine chipping and cracks may be present on the cut surface formed after the scribing process. The cracks may propagate from the defect as a start point, which may cause a problem with reliability of the display device. For example, the first substrate, the inorganic layer, the planarization layer, and the like may cut together with the temporary substrate by the scribing process. One surface of each of the first substrate, the inorganic layer, and the planarization layer may be formed as a cut surface. In case that fine chipping and cracks are present on the cut surfaces of the first substrate, the inorganic layer, and the planarization layer, the cracks may propagate into the display device during the manufacturing process or after the manufacturing process, which may cause a problem with moisture penetration and a deterioration in reliability. Further, in case that the first substrate and the inorganic layer are cracked, the cracks may propagate to the other constituent elements on the inorganic layer. Particularly, if the cracks propagate to the line or circuit, a defective operation may occur.

In the display device 100 according to an exemplary embodiment of the present disclosure, no cut surface is present on a final product. As described above, the cut surface S1, which is formed during the manufacturing process, is only the cut surface S1 formed by the process of scribing the temporary substrate SUB. All the first substrate 101, the inorganic layer 110, the planarization layer 114, and the bank 115 are not cut by the scribing process. In addition, the temporary substrate SUB including the cut surface S1 is an object to be removed by the LLO process, and the temporary substrate SUB is not included in the display device 100 that is the final product. Therefore, in the display device 100 according to an exemplary embodiment of the present disclosure, the cut surface S1 is not finally formed by the scribing process. Therefore, it is possible to improve reliability by blocking the propagation of cracks starting from the cut surface S1.

Meanwhile, in case that the first substrate is disposed in the entire display area and the entire non-display area of the display device to perform the LLO process, the scribing process is performed after the seal member is formed. In this case, the scribing process may be accurately performed on the end of the seal member, such that all the constituent elements disposed on the lower portion of the seal member may overlap the seal member. However, because a process error occurs during the scribing process, the scribing process is performed on a portion disposed outward from the end of the seal member by a process margin. Therefore, some of the constituent elements, e.g., the planarization layer, the inorganic layer, and the first substrate, which are disposed on the lower portion of the seal member, each have a portion protruding to the outside from the end of the seal member. Because the protruding portion cannot be protected by the seal member, the protruding portion may be easily cracked by external impact during the manufacturing process or after the manufacturing process, and the cracks may easily propagate into the display device.

In the display device 100 according to an exemplary embodiment of the present disclosure, the ends of all the bank 115, the planarization layer 114, the inorganic layer 110, and the first substrate 101 are disposed inside the end of the seal member 141. For example, during the manufacturing process, the ends of the temporary substrate SUB and the sacrificial layer 102 further protrude to the outside than the ends of the bank 115, the planarization layer 114, the inorganic layer 110, and the first substrate 101, such that the seal member 141 is disposed to adjoin the temporary substrate SUB and the sacrificial layer 102. Therefore, even though the end of the temporary substrate SUB further protrudes to the outside than the end of the seal member 141 during the scribing process, the temporary substrate SUB, which further protrudes than the end of the seal member 141, is removed by the LLO process. Therefore, in the display device 100 that is the final product, the seal member 141 may surround the side surfaces of the bank 115, the planarization layer 114, the inorganic layer 110, the first substrate 101, and the inorganic layer 110. Therefore, in the display device 100 according to an exemplary embodiment of the present disclosure, an area in which the seal member 141 is not applied is not present. Therefore, it is possible to suppress or at least reduce the occurrence and propagation of cracks caused by the area in which the seal member 141 is not applied.

Figure 8A:
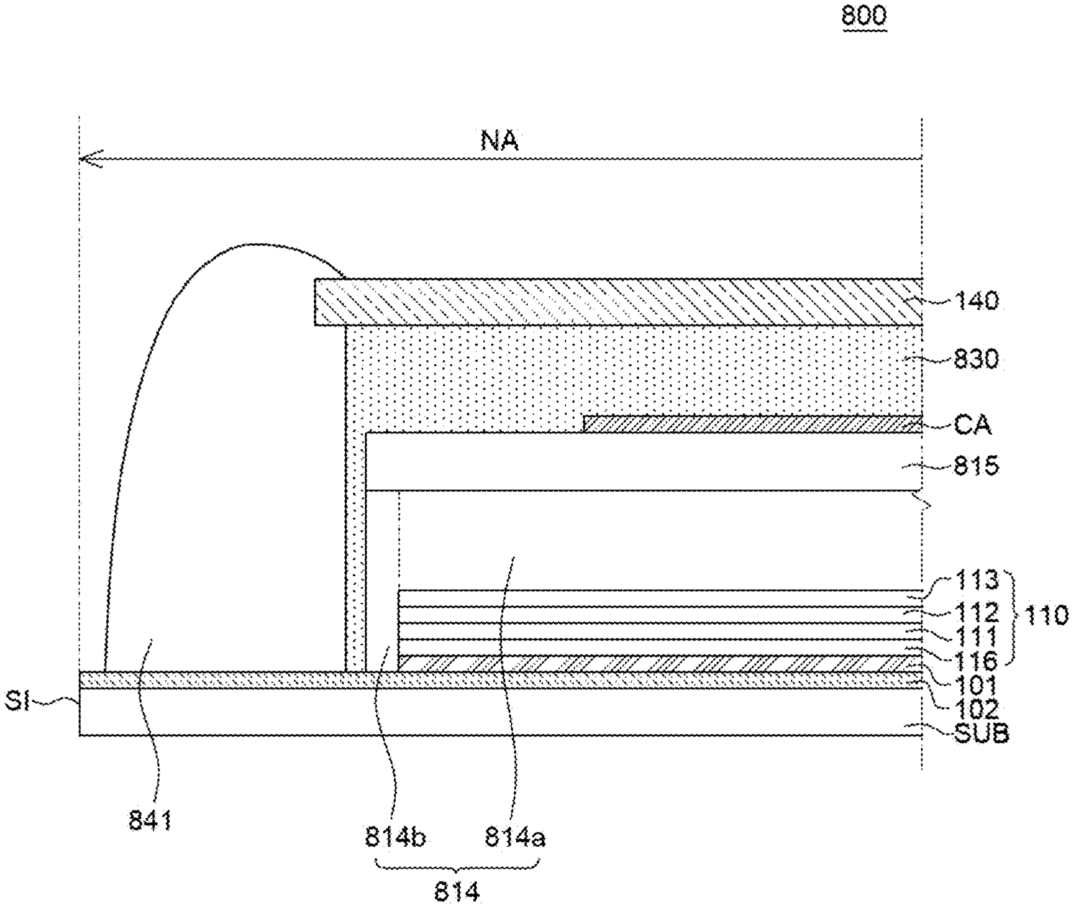
FIG. 8A is a cross-sectional view for explaining a process of manufacturing a display device according to another exemplary embodiment of the present disclosure.
Figure 8B:
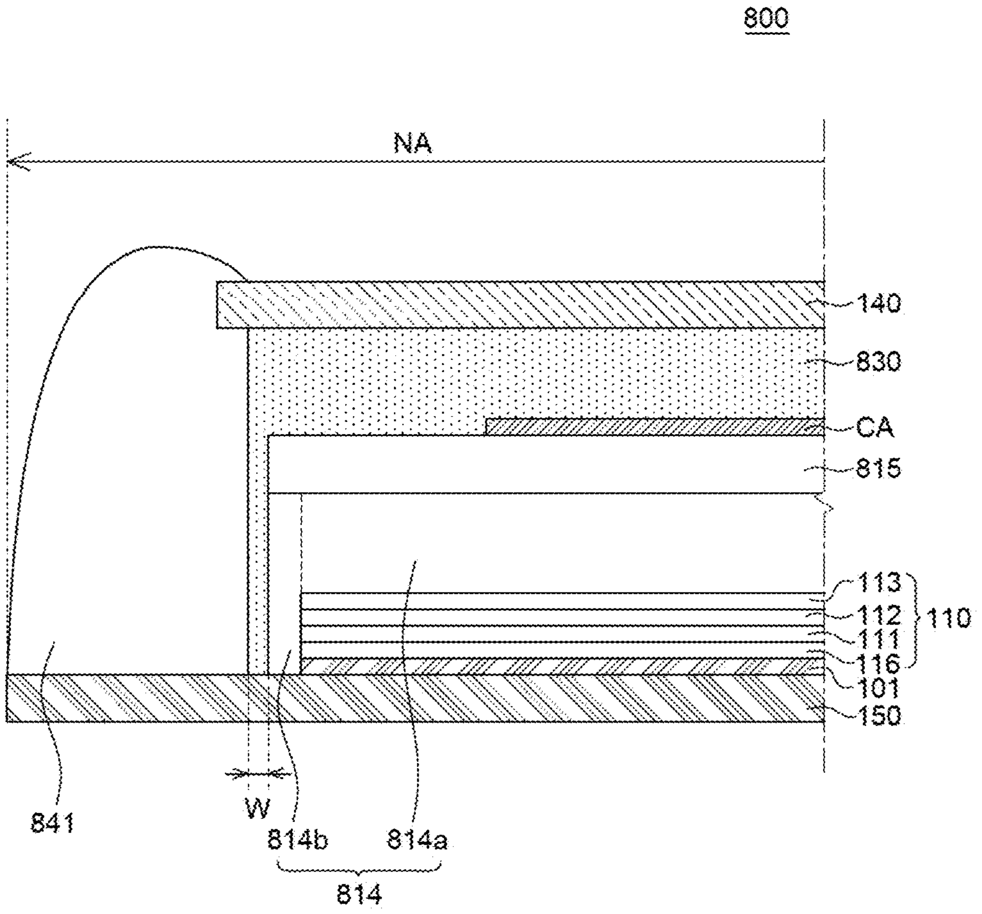
FIG. 8B is a cross-sectional view of the display device according to another exemplary embodiment of the present disclosure.

FIG. 8A is a cross-sectional view for explaining a process of manufacturing a display device according to another exemplary embodiment of the present disclosure. FIG. 8B is a cross-sectional view of the display device according to another exemplary embodiment of the present disclosure. FIG. 8A is a cross-sectional view illustrating a state made after the scribing process is performed, and FIG. 8B is a cross-sectional view illustrating a state made after the LLO process is performed. A display device 800 in FIGS. 8A and 8B is substantially identical in configuration to the display device 100 in FIGS. 1 to 7B, except for the arrangements of a planarization layer 814, a bank 815, a bonding layer 830, and a seal member 841. Therefore, repeated descriptions of the identical components will be omitted.

First, with reference to FIG. 8A, the temporary substrate SUB, the sacrificial layer 102, the first substrate 101, and the inorganic layer 110 are disposed, and the planarization layer 814 is disposed on the temporary substrate SUB, the first substrate 101, and the inorganic layer 110.

The planarization layer 814 is disposed on the temporary substrate SUB, the first substrate 101, and the inorganic layer 110. The planarization layer 814 is disposed to cover the entire surface of the first substrate 101. An end of the planarization layer 814 may be disposed in the non-display area NA and positioned outside the end of the first substrate 101 and the end of the inorganic layer 110.

The planarization layer 814 may include a first planarization layer 814*a* and a second planarization layer 814*b*. The first planarization layer 814*a* is disposed in an area that overlaps the first substrate 101. The second planarization layer 814*b* is disposed in an area that does not overlap the first substrate 101.

The bank 815 is disposed on the temporary substrate SUB, the first substrate 101, the inorganic layer 110, and the planarization layer 814. An end of the bank 815 may be disposed in the non-display area NA and positioned on the same plane as an end of the second planarization layer 814*b*. However, the present disclosure is not limited thereto. The end of the bank 815 may be positioned inside the end of the second planarization layer 814*b*.

The cathode CA, the bonding layer 830, and the second substrate 140 may be disposed on the bank 815.

The bonding layer 830 may be disposed on the bank 815 to surround side surfaces of the first substrate 101, the inorganic layer 110, the planarization layer 814, and the bank 815. Therefore, with reference to FIG. 8A, the end of the second planarization layer 814*b* may be positioned inside the end of the bonding layer 830. Therefore, the bonding layer 830 may surround the side surface of the planarization layer 814. The end of the bonding layer 830 may adjoin the sacrificial layer 102.

The second substrate 140 may adjoin a top surface of the bonding layer 830. In this case, the end of the second substrate 140 may be disposed outside the ends of the first substrate 101, the inorganic layer 110, the planarization layer 814, the bank 815, and the bonding layer 830.

The seal member 841 may surround the side surface of the second substrate 140. The seal member 841 may cover the end of the bonding layer 830.

Next, with reference to FIG. 8B, the first substrate 101 and the temporary substrate SUB may be separated by the LLO process. Further, in the LLO process, the first substrate 101, the second planarization layer 814*b*, the bonding layer 830, and the seal member 841 may be separated from the temporary substrate SUB. Therefore, the second planarization layer 814*b*, the bonding layer 830, and the seal member 841 may be provided outside the first substrate 101 and disposed on the same layer as the first substrate 101.

Meanwhile, to further facilitate the LLO process, a width W of the bonding layer 830 disposed on the same layer as the first substrate 101 may be 100 μm or less. In the LLO process, the bonding layer 830 and the temporary substrate SUB may be separated by the LLO process because the sacrificial layer 102 is present between the bonding layer 830 and the temporary substrate SUB. However, the LLO process may not be easily performed because of a bonding force of the bonding layer 830. Therefore, the width W of the bonding layer 830, which is disposed on the same layer as the first substrate 101, may beset to 100 μm or less in a range or 1 to 100 μm, optionally 10 to 80 μm, further optionally 40-60 μm, such that the bonding force between the bonding layer 830 and the temporary substrate SUB may be reduced, thereby further facilitating the LLO process.

In the display device 800 according to another exemplary embodiment of the present disclosure, the planarization layer 814 includes the second planarization layer 814*b* disposed to surround the side surfaces of the inorganic layer 110 and the first substrate 101. In addition, the bonding layer 830 is disposed to surround the side surfaces of the first substrate 101, the inorganic layer 110, and the pixel part 120. The seal member 841 is disposed to surround the side surfaces of the bonding layer 830 and a second substrate 840. Therefore, in the display device 800 according to another exemplary embodiment of the present disclosure, the first substrate 101 and the inorganic layer 110 may not be disposed on the outer peripheral portion of the display device 800, and the planarization layer 814, the bonding layer 830, and the seal member 841 may protect the ends of the first substrate 101 and the inorganic layer 110. Therefore, the planarization layer 814, the boding layer 830, and the seal member 841 may each serve as a bumper in the event of a lateral collision, thereby improving the rigidity of the side surface. Therefore, the first substrate 101 and the inorganic layer 110 may not be damaged or cracked by impact applied from the outside of the display device 800. Therefore, in the display device 800 according to another exemplary embodiment of the present disclosure, it is possible to improve reliability and reduce a defective operation caused by the cracks.

In the display device 800 according to another exemplary embodiment of the present disclosure, no cut surface is present on a final product. As described above, the cut surface S1, which is formed during the manufacturing process, is only the cut surface S1 formed by the process of scribing the temporary substrate SUB. All the first substrate 101, the inorganic layer 110, the planarization layer 814, and the bank 815 are not cut by the scribing process. In addition, the temporary substrate SUB including the cut surface S1 is an object to be removed by the LLO process, and the temporary substrate SUB is not included in the display device 800 that is the final product. Therefore, in the display device 800 according to another exemplary embodiment of the present disclosure, the cut surface S1 is not finally formed by the scribing process. Therefore, it is possible to improve reliability by blocking the propagation of cracks starting from the cut surface S1.

In the display device 800 according to another exemplary embodiment of the present disclosure, the ends of all the bank 815, the planarization layer 814, the inorganic layer 110, and the first substrate 101 are disposed inside the end of the seal member 841. Therefore, in the display device 800 that is the final product, the seal member 841 may surround the side surfaces of the bank 815, the planarization layer 814, the inorganic layer 110, the first substrate 101, and the inorganic layer 110. Therefore, in the display device 800 according to another exemplary embodiment of the present disclosure, an area in which the seal member 841 is not applied is not present. Therefore, it is possible to suppress or at least reduce the occurrence and propagation of cracks caused by the area in which the seal member 841 is not applied.

The exemplary embodiments of the present disclosure can also be described as follows:

According to an aspect of the present disclosure, there is provided a display device. The display device comprise a first substrate including a display area having a plurality of pixels, and a non-display area surrounding the display area, the first substrate being made of one of transparent conducting oxide and oxide semiconductor, an inorganic layer on the first substrate, a planarization layer on the inorganic layer, a bonding layer on the plurality of inorganic layers and the planarization layer, and a second substrate on the bonding layer, wherein the planarization layer includes a first planarization layer overlapping the first substrate; and a second planarization layer surrounding a side surface of the first planarization layer.

The second planarization layer may surround a side surface of the inorganic layer and a side surface of the first substrate.

The display device may further comprise a flexible film on the first substrate at one side of the non-display area, wherein the second planarization layer may be in the non-display area at a lateral portion that may exclude one side at which the flexible film is disposed.

The second planarization layer may extend further outside relative to the first substrate and on the same layer as the first substrate.

The first planarization layer and the second planarization layer may be integrated.

The display device may further comprise a seal member surround a side surface of the second substrate, wherein an end of the second planarization layer may be further inside relative to an end of the seal member.

The first substrate, a portion of the second planarization layer, and a portion of the seal member may be on the same layer.

The display device may further comprise a polarizing plate or barrier film bonded to a bottom surface of the first substrate, a bottom surface of the second planarization layer, and a bottom surface of the seal member.

An end of the second planarization layer may be further outside relative to an end of the bonding layer.

An end of the first substrate and an end of inorganic layer may be further inside relative to an end of the bonding layer.

An end of the second planarization layer may be further inside relative to an end of the bonding layer.

A width of the bonding layer on the same layer as the first substrate may be 100 μm or less.

According to another aspect of the present disclosure, there is provided a display device. The display device comprises a first substrate including a display area having a plurality of pixels, and a non-display area surrounding the display area, the first substrate being made of one of transparent conducting oxide and oxide semiconductor, a plurality of inorganic layers on the first substrate, a planarization layer on the plurality of inorganic layers, a bonding layer on the plurality of inorganic layers and the planarization layer, a second substrate on the bonding layer, and a seal member surrounding a side surface of the second substrate and a side surface of the planarization layer, wherein the planarization layer surrounds a side surface of the first substrate and a side surface of the inorganic layer.

A bottom surface of the first substrate, a part of a bottom surface of the planarization layer, and a bottom surface of the seal member may be on the same plane.

An end of the bonding layer may be positioned on a top surface of the planarization layer.

The bonding layer may surround a side surface of the planarization layer.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:

a first substrate including a display area having a plurality of sub-pixels, and a non-display area surrounding the display area, the first substrate being made of one of transparent conducting oxide and oxide semiconductor;

an inorganic layer on the first substrate;

a planarization layer on the inorganic layer;

a light-emitting element disposed in each of the plurality of sub-pixels on the planarization layer;

a bonding layer on the inorganic layer, the planarization layer, and the light-emitting element; and a second substrate on the bonding layer, wherein the planarization layer includes:

a first planarization layer overlapping the first substrate in a plan view; and a second planarization layer surrounding a side surface of the first planarization layer.

2. The display device of claim 1, wherein the second planarization layer surrounds a side surface of the inorganic layer and a side surface of the first substrate.

3. The display device of claim 1, further comprising a flexible film on the first substrate at one side of the non-display area, wherein the second planarization layer is in the non display area at a lateral portion that excludes one side at which the flexible film is disposed.

4. The display device of claim 1, wherein an end of the second planarization layer is further outside in a plan view relative to an end of the first substrate, and a portion of the second planarization layer is on a same layer as the first substrate.

5. The display device of claim 1, wherein the first planarization layer and the second planarization layer are integrated.

6. The display device of claim 1, further comprising a seal member surrounding a side surface of the second substrate, wherein an end of the second planarization layer is covered by the seal member.

7. The display device of claim 6, wherein the first substrate, a portion of the second planarization layer, and a portion of the seal member are on a same layer.

8. The display device of claim 6, further comprising a polarizing plate or barrier film bonded to a bottom surface of the first substrate, a bottom surface of the second planarization layer, and a bottom surface of the seal member, wherein the inorganic layer is on a top surface of the first substrate.

9. The display device of claim 1, wherein an end of the second planarization layer is further outside in a plan view relative to an end of the bonding layer.

10. The display device of claim 9, wherein an end of the first substrate and an end of the inorganic layer are further inside in the plan view relative to an end of the bonding layer.

11. The display device of claim 1, wherein an end of the second planarization layer is further inside in a plan view relative to an end of the bonding layer.

12. The display device of claim 11, wherein a portion of the bonding layer is on a same layer as the first substrate, a width of the bonding layer on the same layer as the first substrate being 100 μm or less.

13. A display device, comprising:

a first substrate including a display area having a plurality of sub-pixels, and a non-display area surrounding the display area, the first substrate being made of one of transparent conducting oxide and oxide semiconductor;

a plurality of inorganic layers on the first substrate;

a planarization layer on the plurality of inorganic layers;

a light-emitting element disposed in each of the plurality of sub-pixels on the planarization layer;

a bonding layer on the plurality of inorganic layers, and the planarization layer and the light-emitting element;

a second substrate on the bonding layer; and a seal member surrounding a side surface of the second substrate and a side surface of the planarization layer, wherein the planarization layer surrounds a side surface of the first substrate and a side surface of the inorganic layers.

14. The display device of claim 13, wherein a bottom surface of the first substrate, a part of a bottom surface of the planarization layer, and a bottom surface of the seal member are positioned on a same plane.

15. The display device of claim 13, wherein an end of the bonding layer is on a top surface of the planarization layer.

16. The display device of claim 13, wherein the bonding layer surrounds a side surface of the planarization layer.

* * * * *